(12) United States Patent
Wang et al.

(10) Patent No.: US 9,997,707 B2
(45) Date of Patent: Jun. 12, 2018

(54) PEROVSKITE THIN FILMS HAVING LARGE CRYSTALLINE GRAINS

(71) Applicant: NANYANG TECHNOLOGICAL UNIVERSITY, Singapore (SG)

(72) Inventors: Ning Wang, Singapore (SG); Xiaowei Sun, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 149 days.

(21) Appl. No.: 15/054,280

(22) Filed: Feb. 26, 2016

(65) Prior Publication Data

US 2016/0254472 A1 Sep. 1, 2016

(30) Foreign Application Priority Data

Feb. 26, 2015 (SG) .......................... 10201501431Q

(51) Int. Cl.
*H01L 51/00* (2006.01)
*H01L 51/42* (2006.01)
*C23C 14/06* (2006.01)
*C23C 14/58* (2006.01)

(52) U.S. Cl.
CPC ........ *H01L 51/001* (2013.01); *C23C 14/0694* (2013.01); *C23C 14/5846* (2013.01); *H01L 51/424* (2013.01); *H01L 51/0026* (2013.01); *H01L 51/0037* (2013.01); *H01L 51/0039* (2013.01); *H01L 51/0047* (2013.01); *H01L 2251/308* (2013.01); *Y02E 10/549* (2013.01)

(58) Field of Classification Search
CPC .............. H01L 51/0001; H01L 51/424; C23C 14/0694; C23C 14/5846
USPC ........................................................ 136/263
See application file for complete search history.

(56) References Cited

U.S. PATENT DOCUMENTS

2015/0249170 A1* 9/2015 Snaith ................... H01L 51/422
    136/256
2018/0005764 A1* 1/2018 Jones ................... H01G 9/2059

OTHER PUBLICATIONS

M. Lee et al., "Efficient hybrid solar cells based on meso-superstructured organometal halide perovskites", Science vol. 338, pp. 643-647 (2012).
H. Kim et al., "Lead iodide perovskite sensitized all-solid-state submicron thin film mesoscopic solar cell with efficiency exceeding 9%" Scientific Reports, 2: 591, pp. 1-7 (2012).
Heo, J. H. et al., "Efficient inorganic-organic hybrid heterojunction solar cells containing perovskite compound and polymeric hole conductors," Nature. Photonics, vol. 7, pp. 486-491 (2013).
Burschka, J. et al., "Sequential deposition as a route to high-performance perovskite-sensitized solar cells." Nature vol. 499, pp. 316-319 (2013).
Liu, M. et al., "Efficient planar heterojunction perovskite solar cells by vapour deposition." Nature vol. 501, pp. 395-398 (2013).

(Continued)

*Primary Examiner* — Jayne L Mershon
(74) *Attorney, Agent, or Firm* — Sughrue Mion, PLLC

(57) ABSTRACT

The invention relates generally to perovskite materials, and in particular, to perovskite thin films having large crystalline grains. Methods of forming the perovskite thin films are disclosed herein. The perovskite thin films find particular use in photovoltaic applications.

11 Claims, 21 Drawing Sheets

(56) References Cited

OTHER PUBLICATIONS

Malinkiewicz, O. et al. "Perovskite solar cells employing organic charge transport layers". Nature. Photonics vol. 8, pp. 128-132 (2014).
Liu, D et al., "Perovskite solar cells with a planar heterojunction structure prepared using room-temperature solution processing techniques". Nature. Photonics vol. 8, pp. 133-138 (2014).
Jeon, N. J. et al., "Solvent engineering for high-performance inorganic-organic hybrid perovskite solar cells". Nature. Materials. vol. 13, pp. 897-903 (2014).
Hodes, G, "Perovskite-based solar cells". Science vol. 342, pp. 317-318, (2013) 3 pages total.
Chen, Q. et al. "Planar heterojunction perovskite solar cells via vapor-assisted solution process", J. Am. Chem. Soc. 2014, 136, pp. 622-625.
Noh, J. H. et al., "Chemical management for colorful, efficient, and stable inorganic-organic hybrid nanostructured solar cells". Nano Lett. 2013, 13, pp. 1764-1769.
Pellet, N. et al., "Mixed-organic-cation perovskite photovoltaics for enhanced solar-light harvesting". Angew. Chem. Int. Ed. 2014, 53, pp. 1-8.
Ogomi, Y. et al., "$CH_3NH_3Sn_xPb_{(1-x)}I_3$ perovskite solar cells covering up to 1060 nm". J. Phys. Chem. Lett. 2014, 5, pp. 1004-1011.
Hao, F et al., "Anomalous band gap behavior in mixed Sn and Pb perovskites enables broadening of absorption spectrum in solar cells". J. Am. Chem. Soc. 2014, 136, pp. 8094-8099.
Zhao, Y et al., "$CH_3NH_3Cl$-assisted one-step solution growth of $CH_3NH_3PbI_3$: structure, charge-carrier dynamics, and photovoltaic properties of perovskite solar cells", J. Phys. Chem. C 2014, 118, pp. 9412-9418.
Moore, D et al., "Impact of the organic halide salt on final perovskite composition for photovoltaic applications", APL Mater. 2, 081802 (2014). 8 pages total.
Eperon, G et al., "Morphological Control for high performance, solution-processed planar heterojunction perovskite solar cells". Adv. Func. Mater. 2014, 24, pp. 151-157.
Conings, B. et al., "Perovskite-based hybrid solar cells exceeding 10% efficiency with high reproducibility using a thin film sandwich approach". Adv. Mater. 2014, 26, pp. 2041-2046.
Mitzi, D. "Synthesis, structure, and properties of organic-inorganic perovskites and related materials", Progress in Inorganic Chemistry, vol. 48, pp. 1-121 (1999).
Kojima, A. et al., "Organometal halide perovskites as visible-light sensitizers for photovoltaic cells". J. Am. Chem. Soc. 2009, 131, pp. 6050-6051.
Tan Z-K, et al. "Bright light-emitting diodes based on organometal halide perovskite". Nature Nanotechnology vol. 9, pp. 687-692 (2014).
Zhu H, et al., "Lead halide perovskite nanowire lasers with low lasing thresholds and high quality factors", Nature Materials vol. 14, pp. 636-642 (2015) 8 pages total.
Xing G, et al., "Low-temperature solution-processed wavelength-tunable perovskites for lasing", Nature Materials vol. 13, pp. 476-480 (2014).
Dou, L., et al., "Solution-processed hybrid perovskite photodetectors with high detectivity". Nature Communications 5:5404 (2014) pp. 1-6.
Xiao, Z., et al., "Giant switchable photovoltaic effect in organometal trihalide perovskite devices"., Nature Materials vol. 14, pp. 193-198, 7 pages total (2015).
Liu, M., "Efficient planar heterojunction perovskite solar cells by vapour deposition"., Nature vol. 501, 2013, pp. 395-398, 8 pages total.
Bi, C., "Non-wetting surface-driven high-aspect-ratio crystalline grain growth for efficient hybrid perovskite solar cells"., Nature Communications 6:7747 (2015) pp. 1-7.
Yang, WS., et al. "High-performance photovoltaic perovskite layers fabricated through intramolecular exchange"., Science, vol. 348, pp. 1234-1237 (2015), 5 pages total.
Nie, W., et al. "High-efficiency solution-processed perovskite solar cells with millimeter-scale grains"., Science vol. 347, pp. 522-525 (2015).
Leo, K. "Perovskite photovoltaics: Signs of stability"., Nature Nanotechnology vol. 10, 574-575 (2015).
Green, M. et al., "Photovoltaics: Perovskite cells charge forward"., Nature Materials vol. 14, pp. 559-561 (2015).
Shao, Y. et al., "Origin and elimination of photocurrent hysteresis by fullerene passivation in $CH_3NH_3PbI_3$ planar heterojunction solar cells"., Nature Communications 5:5784 (2014) pp. 1-7.
Zhang W., et al., "Ultrasmooth organic-inorganic perovskite thin-film formation and crystallization for efficient planar heterojunction solar cells"., Nature Communications 6:6142, pp. 1-10 (2015).
Chen, Q. et al., "The optoelectronic role of chlorine in $CH_3NH_3PbI_3$ (Cl)-based perovskite solar cells"., Nature Communications 6:7269 pp. 1-9 (2015).
Eperon, G. et al., "Formamidinium lead trihalide: a broadly tunable perovskite for efficient planar heterojunction solar cells"., Energy Environ. Sci., 2014. 7, pp. 982-988.
Eperon, G. et al., "Morphological Control for High Performance, Solution-Processed Planar Heterojunction Perovskite Solar Cells", Adv. Funct. Mater. 2014, 24, pp. 151-157.
Redecker, M. et al., "High Mobility Hole Transport Fluorene-Triarylamine Copolymers"., Adv. Mater. 1999, 11, No. 3, pp. 241-246.
Wang, J. et al., "Interfacial Control Toward Efficient and Low-Voltage Perovskite Light-Emitting Diodes", Adv. Mater. 2015, 27, pp. 2311-2316.
Yan H, et al. "High-performance hole-transport layers for polymer light-emitting diodes. Implementation of organosiloxane cross-linking chemistry in polymeric electroluminescent devices"., J. Am. Chem. Soc. 2005, 127, pp. 3172-3183.
De Bastiani, M. et al., "Role of the crystallization substrate on the photoluminescence properties of organo-lead mixed halides perovskites"., APL Materials 2, 081509 (2014) 7 pages total.
Vorpahl, S. et al., "Impact of microstructure on local carrier lifetime in perovskite solar cells"., Science vol. 348, pp. 683-686 (2015). 5 pages total.
Shi, D. et al., "Low trap-state density and long carrier diffusion in organolead trihalide perovskite single crystals"., Science vol. 347, pp. 519-522 (2015), 5 pages total.
Dong Q, et al. "Electron-hole diffusion lengths> 175 μm in solution-grown $CH_3NH_3PbI_3$ single crystals"., Science vol. 347, pp. 967-970 (2015), 5 pages total.
Zhao, D. et al., "High-Efficiency Solution-Processed Planar Perovskite Solar Cells with a Polymer Hole Transport Layer"., Adv. Energy Mater. 2015, 5, 1401855, 5 pages total.
Krogstrup P. et al., "Single-nanowire solar cells beyond the Shockley-Queisser limit"., Nature Photonics vol. 7, Apr. 2013, pp. 306-310.
Park, S. et al., "Bulk heterojunction solar cells with internal quantum efficiency approaching 100%"., Nature Photonics vol. 3, pp. 297-303 (2009).
Armin, A. et al., "Quantum efficiency of organic solar cells: electro-optical cavity considerations"., ACS Photonics 1, pp. 173-181 (2014).
Brown, G. et al., "Finite element simulations of compositionally graded InGaN solar cells"., Solar Energy Materials & Solar Cells 94, pp. 478-483 (2010).
Lin, Q. et al., "Electro-optics of perovskite solar cells"., Nature Photonics vol. 9, pp. 106-112 (2015).
Xu J. et al., "Perovskite-fullerene hybrid materials suppress hysteresis in planar diodes"., Nature Communications 6:7081 pp. 1-8 (2015).
Tress W. et al., "Predicting the Open-Circuit Voltage of $CH_3NH_3PbI_3$ Perovskite Solar Cells Using Electroluminescence and Photovoltaic Quantum Efficiency Spectra: the Role of Radiative and Non-Radiative Recombination"., Adv. Energy Mater. 5, 1400812 (2015), 6 pages total.
Tress W. et al., "Understanding the rate-dependent J—V hysteresis, slow time component, and aging in $CH_3NH_3PbI_3$ perovskite solar cells: the role of a compensated electric field"., Energy Environ. Sci. 8, pp. 995-1004 (2015).

(56) References Cited

OTHER PUBLICATIONS

Unger E. et al., "Hysteresis and transient behavior in current-voltage measurements of hybrid-perovskite absorber solar cells"., Energy Environ. Sci. 7, pp. 3690-3698 (2014).

Wang K. et al., "Bulk heterojunction perovskite hybrid solar cells with large fill factor"., Energy Environ. Sci. 8, pp. 1245-1255 (2015).

Green, M. et al., "Solar cell efficiency tables (Version 45)", Prog. Photovoltaics Res. Appl. 23, pp. 1-9 (2015).

Snaith H. et al., "Anomalous hysteresis in perovskite solar cells"., J. Phys. Chem. Lett. 5, pp. 1511-1515 (2014).

Jeon, NJ et al., "Compositional engineering of perovskite materials for high-performance solar cells"., Nature vol. 517, pp. 476-480 (2015), 14 pages total.

Ma, W. et al., "Thermally stable, efficient polymer solar cells with nanoscale control of the interpenetrating network morphology"., Adv. Funct. Mater. 15, pp. 1617-1622 (2005).

Wang, N. et al., "Fluorinated benzothiadiazole-based conjugated polymers for high-performance polymer solar cells without any processing additives or post-treatments"., J. Am. Chem. Soc. 135, pp. 17060-17068 (2013).

Xing G, et al., "Long-range balanced electron-and hole-transport lengths in organic-inorganic $CH_3NH_3PbI_3$"., Science vol. 342, pp. 344-347 (2013), 5 pages total.

Salim T, et al. "Elucidating the role of disorder and free-carrier recombination kinetics in $CH_3NH_3PbI_3$ perovskite films"., Nature Communications 6:7903, (2015), 8 pages total.

Malinkiewicz O. et al., "Metal-Oxide-Free Methylammonium Lead Iodide Perovskite-Based Solar Cells: the Influence of Organic Charge Transport Layers"., Adv. Energy Mater. 2014, 4, 1400345, 9 pages total.

Xiao Z. et al. "Efficient, High Yield Perovskite Photovoltaic Devices Grown by Interdiffusion of Solution-Processed Precursor Stacking Layers"., Energy Environ. Sci. 2014, 7, pp. 2619-2623.

Boopathi K.M. et al., "Preparation of Metal Halide Perovskite Solar Cells Through a Liquid Droplet Assisted Method"., J. Mater. Chem. A. 2015, 3, pp. 9257-9263.

Chen Y. et al., "Layer-by-layer Growth of $CH_3NH_3PbI_{3-x}Cl_x$ for Highly Efficient Planar Heterojunction Perovskite Solar Cells"., Adv. Mater. 2015, 27, pp. 1053-1059.

\* cited by examiner

PEROVSKITE THIN FILMS HAVING LARGE CRYSTALLINE GRAINS

CROSS-REFERENCE TO RELATED APPLICATION

This application claims the benefit of priority of Singapore Patent Application No. 10201501431Q, filed Feb. 26, 2015, the contents of which being hereby incorporated by reference in its entirety for all purposes.

TECHNICAL FIELD

The invention relates generally to perovskite materials, and in particular, to perovskite thin films having large crystalline grains. Methods of forming the perovskite thin films are disclosed herein. The perovskite thin films find particular use in photovoltaic applications.

BACKGROUND

As an emerging photoelectric material, perovskite has evoked widespread scientific and industrial interests due to its versatile applications in solar cells, light-emitting diodes, laser diodes, photodetectors, and thin film photovoltaics. This material is an organic-inorganic trihalide perovskite with an $ABX_3$ structure (where A is an organic or monovalent alkali cation, B a divalent metal ion and each X a halide such as chlorine (Cl), bromine (Br) or iodine (I)). A typical and well-known perovskite compound is methylammonium lead triiodide ($CH_3NH_3PbI_3$), which can be synthesized from cheap materials, in contrast to traditional semiconductors. Various deposition procedures can be employed to fabricate perovskite thin films including simple one-step solution coating, sequential dip coating, vacuum thermal co-evaporation deposition and vapor-assisted solution processes. Taking perovskite solar cells as an example, perovskite thin films exhibit excellent crystallinity, ambipolar transport and large diffusion length for both electrons and holes, which boost the power conversion efficiencies (PCEs) of devices exceeding 16% in planar heterojunction and mesoporous device architectures.

Although the device efficiency of perovskite photovoltaic has constantly been improved in the past few years through optimizing device design, material interfaces and processing techniques, the basic properties of organic-inorganic trihalide perovskites are not well understood. Cavities or pinholes can be found in solution-processed perovskite thin films fabricated with aforementioned methods, and these can cause shunting pathways thereby degrading device performance.

Therefore, it remains a challenge to obtain high quality and continuous perovskite thin films with good uniformity, high coverage rate and large grain size on top of polymer or metal oxide charge transport layers in a photovoltaic device.

SUMMARY

The present disclosure provides an alternative approach for fabricating high-quality perovskite thin films by taking into account the inevitable questions in existing deposition techniques. High-quality perovskite thin films are achieved by combining vacuum and solution-processed methods for the fabrication. In comparison with conventional approaches including one-step solution coating, sequential dip coating, vacuum thermal coevaporation deposition and vapor-assisted solution processes, the present method can achieve high-quality, uniform and optically smooth perovskite thin films with large crystalline grains, and the method is highly reproducible. This method can overcome some inevitable disadvantages compared to other solution-processed technologies, which usually involve large aggregation of precursors or intermediates during fabrication.

For photovoltaic applications, large crystalline grains are highly desirable in significantly reducing charge recombination at grain boundaries. Highly efficient planar heterojunction perovskite solar cells have been realized via this approach. Benefitting from this approach, power conversion efficiency of perovskite solar cells can surpass 18%, and reproducibility is superior. In addition, the fill factors of the present photovoltaic devices are large, which are around 70-85%. It is fully comparable with best fill factor result (~85%) of all existing photovoltaic technologies.

Thus, in accordance with a first aspect of the present disclosure, there is disclosed a method for forming a perovskite thin film having an $ABX_3$ crystalline structure, wherein the crystalline structure comprises an average grain size of more than 1 micron, preferably more than 5 microns, and more preferably, 7 to 10 microns. A in $ABX_3$ may be $CH_3NH_3^+$, $CH_3N_2H_2^+$, or $Cs^+$. B in $ABX_3$ may be $Pb^{2+}$, $Sn^{2+}$. X in $ABX_3$ may be $Cl^-$, $Br^-$ or $I^-$. In one embodiment, the perovskite thin film comprises $CH_3NH_3PbI_3$.

First, a layer of a metal (II) halide ($BX_2$) is formed on a substrate. The formation of the $BX_2$ layer is carried out via vacuum thermal evaporation of the $BX_2$ powder. By carrying out the formation of the $BX_2$ layer via vacuum thermal evaporation, a uniform and smooth $BX_2$ layer can be achieved, thereby enabling the resulted perovskite thin film to be fully pin-hole free and optically smooth, which are significantly important for high quality optoelectronic devices. This step helps to avoid aggregation of $BX_2$ employed in conventional non-vacuum process. For example, in the case where $BX_2$ is $PbI_2$, the $PbI_2$ will inevitably separate out or aggregate during conventional one-step, sequential and vapor-assisted solution coating on account of the high concentration of precursor solution. Although the vacuum thermal co-evaporation deposition may avoid this problem, it is very difficult to control the composition during deposition and the resulted phase purity of perovskite is another question.

Further, the present method offers a very convenient way to fabricate large-area and high-quality perovskite thin films on different substrate types. Generally, there is big technological barrier on how to scale up the effective area of highly efficient lab-scale solar cells to industrial-scale module products with endurable efficiency decline. For the present method, a variety of substrates may be suitable. For example, rigid substrates such as glass, quarts, silicon wafer, and metal foil, or flexible substrates such as polyethylene terephthalate (PET), polyethylene naphthalate (PEN), polycarbonate (PC), polyether sulfone (PES), polyimide (PI), or fiber reinforced plastic (FRP) may be suitable.

The $BX_2$ powder may be evaporated under vacuum of $1 \times 10^{-2}$ to $1 \times 10^{-5}$ Pa, and at a deposition rate of 0.1 to 50 Å/s, and at 210 to 230° C.

Next, a solution of an organic halide or a metal (I) halide (AX) is deposited on the $BX_2$ layer. The deposition step is carried out via spin coating the AX solution on the $BX_2$ layer. The spin coating process may be carried out at various rotation speeds, such as 150 to 15,000 rpm/s, and for a period of 5 to 300 s.

After the spin coating process, the $BX_2$ and AX layers are thermally annealed to form the perovskite thin film. The annealing process may be carried out for various timings and at various temperatures. For example, the $BX_2$ and AX layers may be annealed for 0.01 to 24 h at 90 to 300° C.

By carrying out thermally annealing of the $BX_2$ and AX layers, complete transformation of $BX_2$ to perovskite structure is achieved. In contrast, incomplete transformation can usually be observed in conventional solution or non vacuum-based methods, which can heavily affect the resulted device performance.

In a second aspect, a perovskite thin film having an $ABX_3$ crystalline structure obtained from the method of the first aspect is disclosed, wherein the crystalline structure comprises an average grain size of more than 1 micron. Preferably, the average grain size is more than 5 microns, such as 7 to 10 microns.

In a third aspect, a method for forming a planar heterojunction perovskite solar cell is disclosed. The method comprises depositing a layer of poly(3,4-ethylene dioxythiophene)-poly(styrene sulfonate) (PEDOT:PSS) on a glass substrate pre-coated with indium-tin oxide (ITO). The deposition may be carried out via spin coating.

The method further comprises depositing a layer of poly (9,9-dioctylfluorene-co-N-(4-(3-methylpropyl))diphenylamine) (TFB) on the layer of PEDOT:PSS. The deposition may be carried out via spin coating.

Next, a perovskite thin film is formed on the layer of PEDOT:PSS according to the first aspect as follows: forming via vacuum thermal evaporation a layer of a metal (II) halide ($BX_2$) on the layer of TFB, followed by depositing via spin coating a solution of an organic halide or a metal (I) halide (AX) on the $BX_2$ layer; followed by annealing the $BX_2$ and AX layers to form a perovskite thin film, wherein A is $CH_3NH_3^+$, $CH_3N_2H_2^+$, or $Cs^+$, B is $Pb^{2+}$, $Sn^{2+}$, and X is $Cl^-$, $Br^-$ or $I^-$.

The method further comprises depositing a layer of [6,6]-phenyl-C61-butyric acid methyl ester (PCBM) on the perovskite thin film and forming a top metal electrode on the PCBM layer to form the solar cell. The deposition may be carried out via spin coating. The formation may be carried out via vacuum thermal evaporation.

BRIEF DESCRIPTION OF THE DRAWINGS

In the drawings, like reference characters generally refer to the same parts throughout the different views. The drawings are not necessarily drawn to scale, emphasis instead generally being placed upon illustrating the principles of various embodiments. In the following description, various embodiments of the invention are described with reference to the following drawings.

DESCRIPTION

Figure 1A:
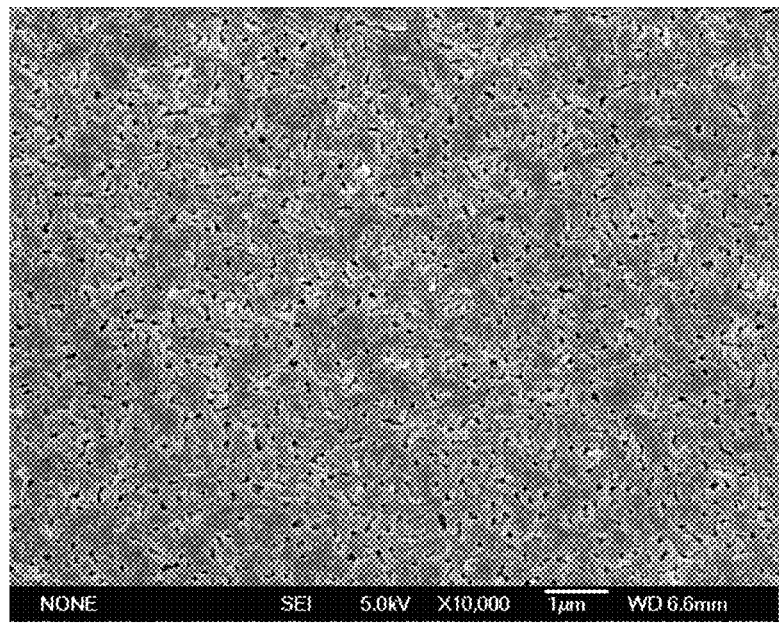
FIG. 1A and FIG. 1B show the scanning electron microscopy (SEM) images of $PbI_2$ deposited on a glass substrate through conventional spin coating method. It is very clear that the coverage rate in this sample is low, and many cavities can be distinctly observed. Specially, many big cavities can be found in this sample (FIG. 1B), and some apparent aggregation of $PbI_2$ can also be found, which are very disadvantageous for the transformation of $PbI_2$ to $CH_3NH_3PbI_3$ perovskite. In general, the $PbI_2$ crystal will separate out or aggregate during spin coating because of the high concentration of $PbI_2$ in solvent. Furthermore, the fast volatilization process will make this spin coating become uncontrollable and thus the reproducibility in obtain high-quality $PbI_2$ is low.
Figure 1B:
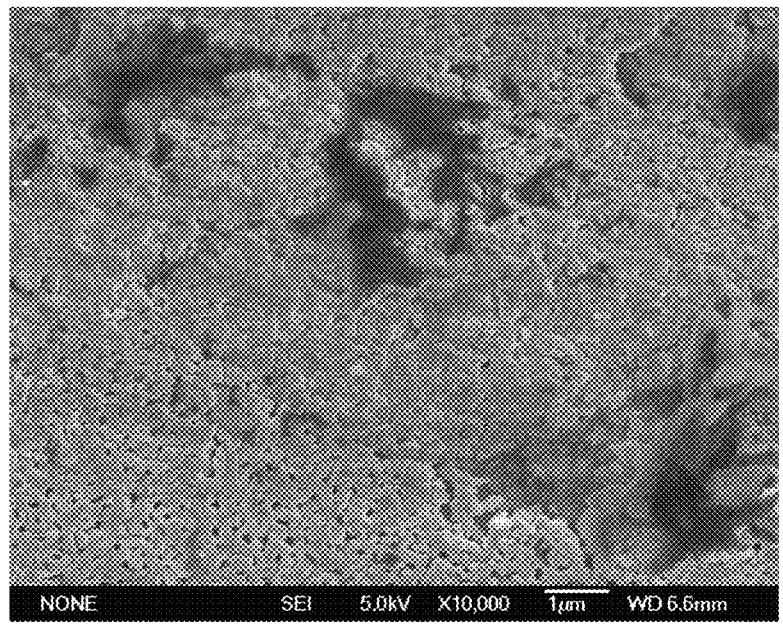
Figure 2A:
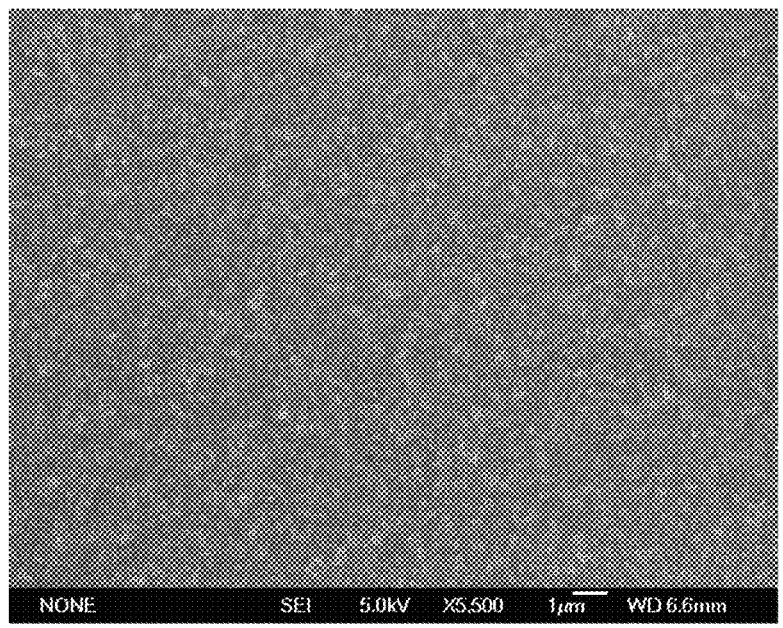
FIG. 2A and FIG. 2B show the SEM images of $PbI_2$ deposited on a glass substrate via vacuum thermal evaporation deposition. The sample deposited with vacuum thermal evaporation deposition method looks very uniform and smooth within a large range, and there are less cavities and higher coverage rate than that from the conventional spin coating approach. The smooth and uniform properties are more favorable for the next-step of perovskite transformation, which will directly affect the resulted device performance.
Figure 2B:
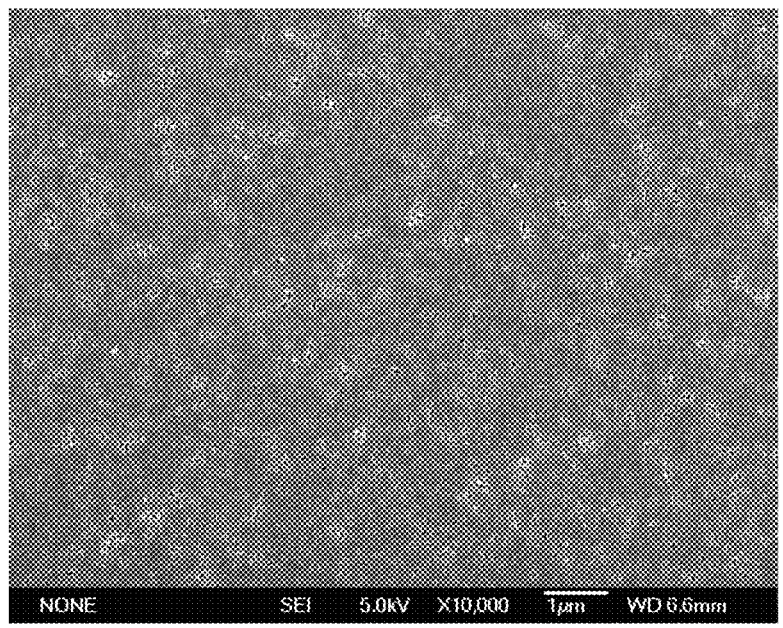

The following detailed description refers to the accompanying drawings that show, by way of illustration, specific details and embodiments in which the invention may be practised. These embodiments are described in sufficient detail to enable those skilled in the art to practise the invention. Other embodiments may be utilized and structural, logical, material and electrical changes may be made without departing from the scope of the invention. The various embodiments are not necessarily mutually exclusive, as some embodiments can be combined with one or more other embodiments to form new embodiments.

For photovoltaic applications, large crystalline grains are highly desirable in significantly reducing charge recombination at grain boundaries, which have vital impact for device performance. In the present disclosure, it is successfully demonstrated the growth of a perovskite thin film with a large average grain size approaching 7 microns by combining vacuum and solution-processed approaches, which is the largest size for $CH_3NH_3PbI_3$ perovskite, which is used as photoactive layer for efficient planar heterojunction perovskite solar cells. Featuring a lower highest occupied molecular orbital (HOMO, 5.4 eV) of poly(9,9-dioctylfluorene-co-N-(4-(3-methylpropyl))diphenylamine) (TFB) than that (5.1 eV) of poly(3,4-ethylene dioxythiophene)-poly(styrene sulfonate) (PEDOT:PSS), devices with $CH_3NH_3PbI_3$ (HOMO, 5.4 eV) sandwiched between very thin PEDOT:PSS/TFB and [6,6]-phenyl-C61 butyric acid methyl ester (PCBM) showed high PCEs with remarkable fill factors. Self-consistent photoelectric simulations were carried out to identify more clearly the roles played by optical field distribution, energy band and carrier concentration in an operating perovskite solar cell. With this proposed approach, high-quality and micron-sized perovskite photoactive layers with full coverage on the substrates were achieved. Excitingly, the device performance based on micron-sized perovskite surpasses that with traditional two-step films. Correspondingly, the carrier diffusion length and trap-state density of the proposed films are superior to the traditional ones. Building on this very promising method, it has been achieved a hysteresis-free PCE as high as 18.56% with a fill factor of 84.5% under standard AM 1.5G illumination in a planar heterojunction with micron-sized perovskite morphology, which demonstrates the potential for a wide variety of applications in photovoltaic fields.

Experiment Details

Materials:

Unless specially stated, all chemicals were used as received. 1,2-dichlorobenzene (ODCB, 99%), lithium fluoride (LiF, powder, 99.999% trace metals basis), lead iodide ($PbI_2$, beads, anhydrous, 99.999% trace metals basis), methylamine (33 wt % in ethanol), and isopropyl alcohol(anhydrous) and hydroiodic acid (HI, 57 wt % in water) were purchased form Sigma-Aldrich. [6,6]-phenyl-C61-butyric acid methyl ester (PCBM) was purchased from Nano-C. Commercial indium tin oxide (ITO) substrates and poly[(9, 9-dioctylfluorenyl-2,7-diyl)-co-(4,4'-(N-(4-sec-butylphenyl)diphenylamine)] (TFB, MW>30000 (GPC)) were purchased from Lumtec. Poly(3,4-ethylenedioxythiophene):poly(styrene sulfonate) (PEDOT:PSS, Clevios™ P VP AI 4083) was obtained from Heraeus.

Synthesis of Methylammonium Iodide:

The methylammonium halide precursors ($CH_3NH_3I$) were synthesized through the reaction of hydroiodic acid (HI) with methylamine followed by recrystallization from ethanol. An equimolar amount of HI (57 wt % in water) was added dropwise into the methylamine (33 wt % in ethanol) at 0° C. under stirring. Upon drying at 100° C., a snow-white powder was obtained, which was further dried overnight in a vacuum chamber and purified with ethanol before use.

Device Fabrication:

The pre-cleaned ITO patterned glass were cleaned ultrasonically with an alconox (degergent) solution, followed by sonication in sequence with deionized water, acetone and isopropyl alcohol for 15 min each, then the substrates were dried using a stream of nitrogen. Devices were prepared on cleaned ITO substrates by spin coating a thin film (20 nm) of PEDOT:PSS (filtered using a 0.45-μm PTFE syringe filter prior to use) for 60 s under 3000 revolutions per minute with an acceleration of 700, which resulted in a thickness of ~20 nm. The PEDOT:PSS coated substrates were heated on a hot plate at 135° C. for 20 min in air. After thermal annealing the substrates were immediately transferred into a nitrogen glove box ($O_2$<0.5 ppm, $H_2O$<0.5 ppm) and a 15-min annealing under 120° C. was performed in order to further remove the residual water. After cooling to room temperature, on top of this layer a thin film of TFB was deposited from an ODCB solution with a concentration of 5 mg ml$^{-1}$ using spin coating method with a speed of 3000 revolutions per minute. The ITO/PEDOT:PSS/TFB substrates were heated at 110° C. for 20 min in glove box. Then the substrates were cooled down to room temperature and transferred into a vacuum chamber integrated into an inert glove box and evacuated to a pressure of $3\times10^{-4}$ Pa. The $PbI_2$ layers were then deposited through vacuum thermal evaporation to the desired film thickness. After depositing the $PbI_2$ layers, the substrates were taken out from chamber and transferred to a spin coater. $CH_3NH_3I$ solution with a concentration of 25 mg ml$^{-1}$ in isopropyl alcohol was loaded on the top of $PbI_2$ thin film and spin coated with different speed. The substrates were heated on a hot plate at 70° C. for 5 min. Then, the substrates were washed twice using isopropyl alcohol and heated on a hot plate at 70° C. for another 5 min with the purpose of removing residual $CH_3NH_3I$ and solvent. After cooling, the substrates were annealed in a covered petri dish containing DMF solution under 100° C. for different timings. After depositing the perovskite photoactive layers, a 20 mg ml$^{-1}$ PCBM in ODCB solution was spin coated onto the photoactive layers with a speed of 3000 revolutions per minute for 25 s. The devices were heated on a hot plate at 100° C. for 60 min. The device was completed by the thermal evaporation of a top metal electrode under a base pressure of $5\times10^{-4}$ Pa to a thickness of 100 nm. The active area of device was obtained using an appropriate mask (3.2 mm×3.2 mm), and the devices were then encapsulated with a glass cover using an ultraviolet-curable epoxy sealant with an ultraviolet exposure of 1.1 min.

Deposition of $PbI_2$ Thin Films:

After depositing TFB thin film on the top of PEDOT:PSS layer and corresponding annealing treatment, the substrates were transferred into the vacuum chamber integrated with the glove box. About 500 mg $PbI_2$ powder was placed in a quartz crucible, and the distance from substrate to crucible is about 30 cm. The sources are directed upwards with an angle of approximately 90° with respect to the bottom of the chamber. There are two shutters, one is placed on the top of crystal crucible and the other is below the substrate holder. The evaporation rate of $PbI_2$ was monitored using a quartz crystal oscillator placed between substrate and crucible and close to the substrate. And the evaporation can be precisely adjusted through controlling the input current on quartz crucible. Various thickness of $PbI_2$ was obtained under $3\times10^{-4}$ Pa by evaporating $PbI_2$ at various temperatures in the range 210-230° C. with evaporation rate varying from 0.2-1 Å/s. After depositing the $PbI_2$ layer, the high-purity nitrogen gas (>99.999%) was loaded into the vacuum chamber up to $1\times10^5$ Pa. Then, the substrates were transferred into the glove box and heated at 100° C. for 10 min.

Characterization

The optical microscope images were conducted using an optical-filed microscope (Model: Olympus BX51M) with 5× and 10× lens under Olympus U-DICR prism at room temperature. Optical characteristics were collected using a PerkinElmer Lambda 950 ultraviolet-visible-near infrared spectrophotometer in the range 300-900 nm. All samples for absorbance measurement were fabricated using identical process in comparison with the photoactive layers in device architecture. Samples consisted of perovskites prepared on glass and coated with the inert polymer poly(methyl methacrylate) as protective layers. XRD spectra of the prepared films were measured using a Bruker Advance D8 X-ray diffractometer equipped with a LynxEye detector, Cu tube (CuKα=1.5418 Å) and operated at 40 KV and 30 mA with a 2 theta scan range of 10-70°. The film thickness was determined by a surface profiler (KLA-Tencor P-10). The surface morphology of the perovskite films were performed using a Jeol JSM-7100F filed-emission scanning electron microscope with an accelerating voltage of 5 KV. The current density-voltage sweeps of all solar cells were measured through Keithley 2400 source meter under simulated air mass 1.5-global illumination (100 mW cm$^{-2}$) using a Xenon-lamp-based solar simulator (Solar Light Co. Inc.) and a calibrated Si-reference cell certified by the National Renewable Energy Laboratory, USA. This calibrated Si-reference cell was used for light intensity calibration every time before sweep. The mismatch factor was calculated to be less than 2%. The sweeps were measured by reverse and forward scans (forward from 1.2 V to −1.0 V and reverse from −1.0 V to 1.2 V). The step voltage was set at 15 mV and the delay time was modulated, which is a delay set at each voltage step before sweeping each current. A mask (0.09 cm$^2$) was employed during device measurement to avoid any probable edge effect. The external quantum efficiency spectra were recorded with a PVE 300 (Bentham) system comprised of a Xenon lamp, a momochoromator, a chopper, a lock-in amplifier and a calibrated silicon photodetector.

Method for Optical and Electrical Modelling
APSYS Simulation

The commercial simulation package of APSYS enables the numerical simulations to the perovskite solar cell devices studied in this disclosure. APSYS is able to solve the Poisson's equations, drift-diffusion equations and the continuity equations with proper boundary conditions and material parameters set by users.

The Poisson's equations solved in the simulator are as follows:

$$-\nabla(\nabla V) = \frac{e}{\varepsilon_s}(-n + p + N_D^+ - N_A^-)$$

where V is the potential distribution within each semiconductor layer, and n, p, $N_D^+$ and $N_A^-$ denote the electron concentration, hole concentration, ionized donor concentration and the ionized acceptor concentration, respectively.

The relationship between the current density and the applied voltage is calculated by the following equations, $$J_n = q \cdot \mu_n \cdot n \cdot E + e \cdot D_n \cdot \nabla n$$

$$J_p = q \cdot \mu_p \cdot p \cdot E + e \cdot D_p \cdot \nabla p$$

where, $J_n$ and $J_p$ represent the spatial electron current density and the hole current density, respectively. $\mu_n$ and $\mu_p$ are used to account for the electron mobility and the hole mobility, respectively, while E represents the applied electric field. $D_n$ and $D_p$ stand for the diffusion constants for electrons and hole, respectively, and they can be calculated according to the well-known Einstein relationship.

The current continuity equations employed in this simulator are shown as follows:

$$\nabla \cdot J_n - \sum_j R_n^{tj} - R_{sp} - R_{au} + G_{opt}(t) = \frac{\partial n}{\partial t} + N_D \frac{\partial f_D}{\partial t}$$

$$\nabla \cdot J_p + \sum_j R_p^{tj} + R_{sp} + R_{au} - G_{opt}(t) = -\frac{\partial p}{\partial t} + N_A \frac{\partial f_A}{\partial t}$$

where the electron (n) and hole (p) recombination rate is achieved through the $j_{th}$ deep trap, which are shown by $$\sum_j R_n^{tj} \text{ and } \sum_j R_p^{tj}.$$

However, in order to simplify the calculations, the deep trap-caused recombination rate was treated by setting a recombination lifetime, such that $$\sum_j R_n^{tj} = \frac{n - n_0}{\tau_n} \text{ and } \sum_j R_p^{tj} = \frac{p - p_0}{\tau_p}$$

in which $\tau_n$ and $\tau_p$ are the trap-caused recombination lifetimes for electrons and holes, respectively. $R_{sp}$ and $R_{au}$ denote the spontaneous recombination rate and Auger recombination rate. $G_{opt}(t)$ represents the carrier generation rate caused by the external influence such as the optical excitation with high energy photons. Here, $f_D$ and $f_A$ mean the occupancy of the donor and acceptor levels, respectively with $N_D$ and $N_A$ denoting the donor and acceptor concentration, respectively.

FDTD Simulation
Calculation of Light Intensity Distribution Across the Solar Cell Device Using 3D FDTD Method Light intensity distribution across the solar cell device is derived using 3D FDTD method. Finite-difference time-domain (FDTD) method is a numerical technique to solve Maxwell's equations in complex geometries. The electric and magnetic vector components are solved in a leapfrog manner and evolve forward in time. The resulting solution is electric and magnetic vectors in time domain and can be converted to vectors in the frequency domain by exploiting Fourier transforms.

The FDTD method adopts the Yee's algorithm that discretizes the computation domain with regular, structured, staggered, rectangular grids and the electric and magnetic fields are staggered in both space and time. In 3D Cartesian coordinate system, two grid cells are used for discretization. Each of them has dimensions Δx, Δy, and Δz along respective axis.

The coordinate of a node on the grid can be expressed in discrete form as: $(x,y,z)_{i,j,k}=(i\Delta x, j\Delta y, k\Delta z)$, where i, j, and k are integers. Similarly, time is discretized as $t=n\Delta t$. An arbitrary function $f(x,y,z,t)$ at any node can be expressed as:

$$f(x,y,z,t)=f(i\Delta x, j\Delta y, k\Delta z, n\Delta t)=f_{i,j,k}^n$$

Therefore, the Maxwell's equations could be developed into a discretized form leading to a total of six recursive equations, which can then be used to solve for the time-dependent vector field intensities. Finally, these time-dependent solutions can be converted to functions of frequency or wavelength by performing Fourier transforms.

$$H_{x,j+\frac{1}{2},k+\frac{1}{2}}^{n+1} = H_{i,j+\frac{1}{2},k+\frac{1}{2}}^{n} +$$

$$\frac{\Delta t}{\mu}\left[\left(\frac{E_{y,i,j+\frac{1}{2},k+1}^{n+\frac{1}{2}} - E_{y,i,j+\frac{1}{2},k}^{n+\frac{1}{2}}}{\Delta z}\right) - \left(\frac{E_{z,i,j+1,k+\frac{1}{2}}^{n+\frac{1}{2}} - E_{z,i,j,k+\frac{1}{2}}^{n+\frac{1}{2}}}{\Delta y}\right) - M_{x,i,j+\frac{1}{2},k+\frac{1}{2}}^{n+\frac{1}{2}}\right]$$

$$H_{y,i+\frac{1}{2},j,k+\frac{1}{2}}^{n+1} = H_{y,i+\frac{1}{2},j,k+\frac{1}{2}}^{n} +$$

$$\frac{\Delta t}{\mu}\left[\left(\frac{E_{z,i+1,j,k+\frac{1}{2}}^{n+\frac{1}{2}} - E_{z,i,j,k+\frac{1}{2}}^{n+\frac{1}{2}}}{\Delta x}\right) - \left(\frac{E_{x,i+\frac{1}{2},j,k+1}^{n+\frac{1}{2}} - E_{x,i+\frac{1}{2},j,k}^{n+\frac{1}{2}}}{\Delta z}\right) - M_{y,i+\frac{1}{2},j,k+\frac{1}{2}}^{n+\frac{1}{2}}\right]$$

$$E_{x,i+\frac{1}{2},j,k}^{n+\frac{1}{2}} = E_{x,i+\frac{1}{2},j,k}^{n-\frac{1}{2}} + \frac{\Delta t}{\varepsilon}\left[\left(\frac{H_{z,i+\frac{1}{2},j+\frac{1}{2},k}^{n} - H_{z,i+\frac{1}{2},j-\frac{1}{2},k}^{n}}{\Delta y}\right) - \right.$$

$$\left.\left(\frac{H_{y,i+\frac{1}{2},j,k+\frac{1}{2}}^{n} - H_{y,i+\frac{1}{2},j,k-\frac{1}{2}}^{n}}{\Delta z}\right) - J_{x,i+\frac{1}{2},j,k}^{n}\right]$$

$$E_{y,i,j+\frac{1}{2},k}^{n+\frac{1}{2}} = E_{y,i,j+\frac{1}{2},k}^{n-\frac{1}{2}} + \frac{\Delta t}{\varepsilon}\left[\left(\frac{H_{x,i,j+\frac{1}{2},k+\frac{1}{2}}^{n} - H_{x,i,j+\frac{1}{2},k-\frac{1}{2}}^{n}}{\Delta z}\right) - \right.$$

$$\left.\left(\frac{H_{z,i+\frac{1}{2},j+\frac{1}{2},k}^{n} - H_{z,i-\frac{1}{2},j+\frac{1}{2},k}^{n}}{\Delta x}\right) - J_{y,i,j+\frac{1}{2},k}^{n}\right]$$

$$E_{z,i,j,k+\frac{1}{2}}^{n+\frac{1}{2}} = E_{z,i,j,k+\frac{1}{2}}^{n-\frac{1}{2}} + \frac{\Delta t}{\varepsilon}\left[\left(\frac{H_{y,i+\frac{1}{2},j,k+\frac{1}{2}}^{n} - H_{y,i-\frac{1}{2},j,k+\frac{1}{2}}^{n}}{\Delta x}\right) - \right.$$

$$\left.\left(\frac{H_{x,i,j+\frac{1}{2},k+\frac{1}{2}}^{n} - H_{x,i,j-\frac{1}{2},k+\frac{1}{2}}^{n}}{\Delta y}\right) - J_{z,i,j,k+\frac{1}{2}}^{n}\right]$$

The simulation setup for the solar cell device is briefly described as follows. One solar cell device structure consists of a 4 um glass substrate, an 100 nm ITO conductive layer, a 20 nm PEDOT layer, a perovskite layer, a 20 nm PCBM layer and 100 nm Al electrode from bottom to the top. The other is inserted a 10 nm TFB layer between the PEDOT and perovskite layers. The thickness of the perovskite layer is set 200 nm, 250 nm, 300 nm, 350 nm, 400 nm, 500 nm, 1000 nm, respectively. The simulation boundary around the device is perfect match layer (PML) in the vertical direction and period in the horizontal direction. The plane wave source is set in the glass um away from the interface between the ITO layer and glass substrate and the wavelength range is from 300 to 800 nm. The plane wave is injected normal to the device layers and from bottom to the top. A monitor is put across the solar device and field distribution is extracted from the monitor along the vertical direction from bottom to the top.

Results

Methodology and Optoelectronic Characteristics.

Figure 7A:
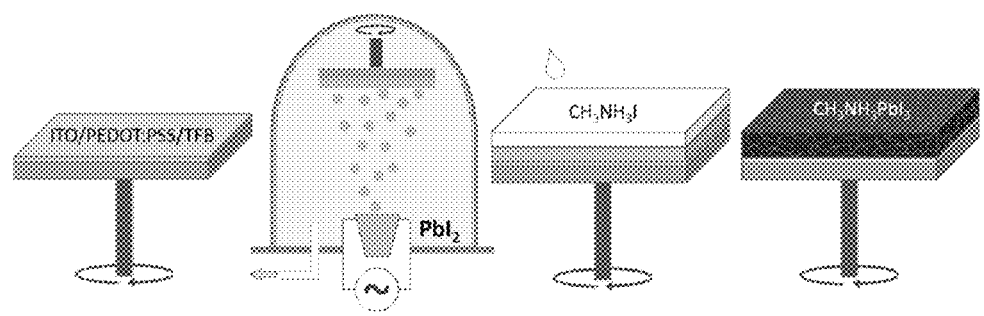
FIG. 7A shows a fabrication process for planar heterojunction perovskite solar cells reported herein. Apart from the vacuum thermally evaporated PbI2, other functional layers such as PEDOT:PSS, TFB, and CH3NH3I are deposited by spin coating method.
Figure 7B:
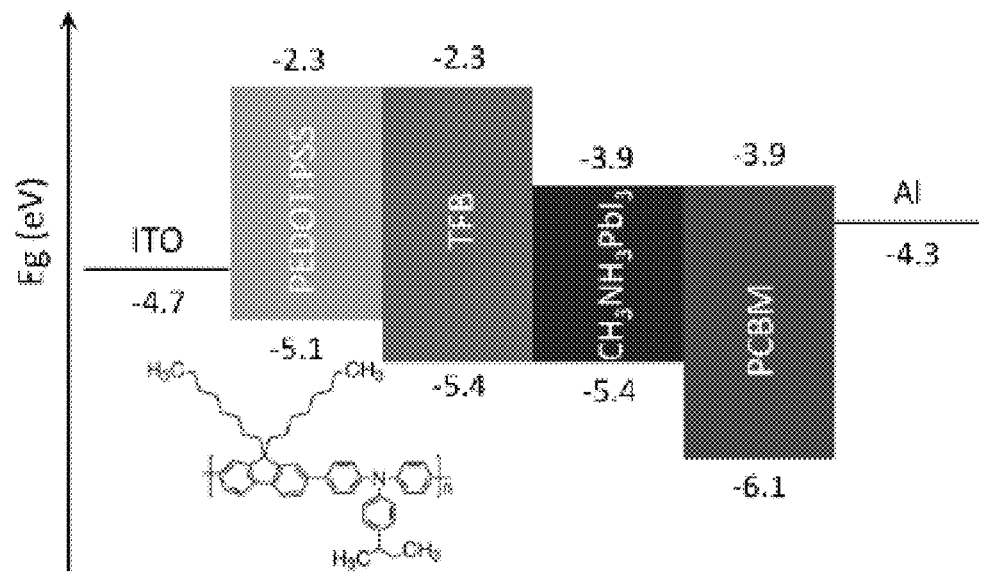
FIG. 7B shows a diagram of energy levels (relative to the vacuum level) of each functional layer in the device. The inset is the molecular structure formula of polymer TFB.
Figure 8:
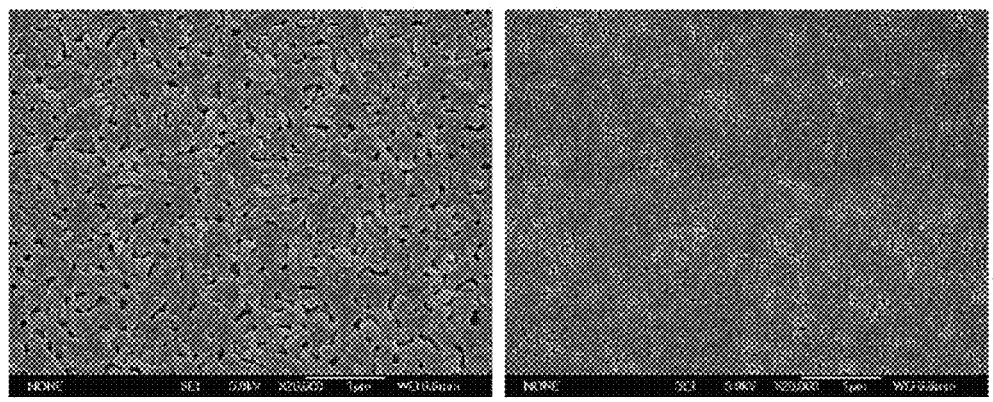
FIG. 8 shows SEM images of $PbI_2$ thin films fabricated with different methods. On the left side, it is the image of $PbI_2$ obtained from solution-processed deposition. The right one is SEM image of $PbI_2$ via vacuum thermal evaporation method.

As shown in FIG. 7A, the preparation process of perovskite thin films is illustrated. Polymer TFB is well known in featuring a hole mobility that is substantially higher than that of PEDOT:PSS. Furthermore, its HOMO level (−5.4 eV) is identical to that of perovskite, which is lower in comparison with that of PEDOT:PSS (−5.1 eV) (FIG. 7B), making TFB an ideal choice for the hole-selective interfacial layer. Additionally, the TFB thin film can be treated by means of appropriate solvent washing to remove small molecular weight residue for further improving conductivity, which is very important in modulating charge balance in photoelectric devices. Benefiting from the perfect energy level alignment in FIG. 7B, the photo-generated free charge carriers/excitons within the photoactive layer can be effectively extracted by either transporting holes to the underlying TFB layer, or through transferring electrons to the adjacent PCBM electron-selective layer. For the present perovskite fabrication process, after spin coating and annealing the PEDOT:PSS and TFB layers, the substrates were transferred to a vacuum chamber and then lead iodide ($PbI_2$) with various thicknesses was deposited on top of the polymer charge-selective layer under a vacuum of $\sim 2\times 10^{-4}$ Pa at different deposition rates (FIG. 8). The corresponding device performance was detected to be sensitive to $PbI_2$ deposition rate, thickness and post-annealing time, so careful attention was paid to ensure that the efficiencies of the devices were reproducible as consistently as possible. Afterwards, the substrates were taken out from the chamber and moved to a hot plate for a 10-minute treatment under 100° C. in glove box. After cooling down to room temperature, the methylammonium iodide ($CH_3NH_3I$) solution was loaded and spun coated on the top of $PbI_2$ thin film. The substrates were immediately transferred to a hot plate for a 10-minute annealing under 75° C. Finally, the substrates were annealed for different timings under 100° C. in a closed petri disc containing dimethylformamide (DMF) solution.

Figure 7C:
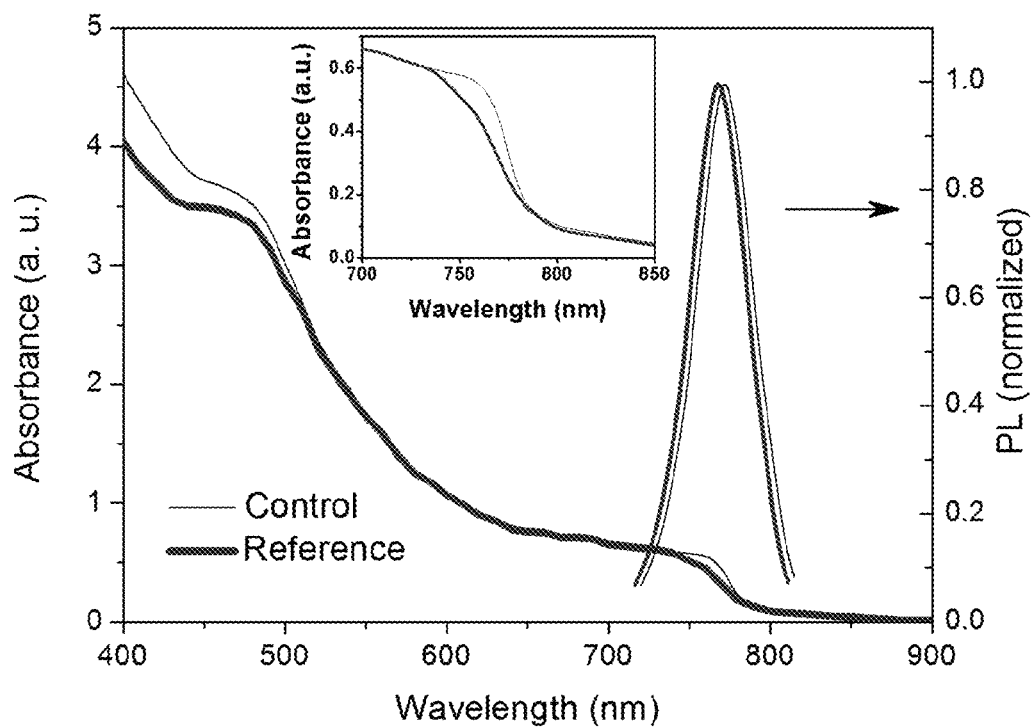
FIG. 7C shows optical absorption characteristic of perovskite thin films fabricated by the present method and conventional two-step processing. The right part of the figure shows the photoluminescence properties of the corresponding perovskite thin films and the inset shows the absorption difference around 760 nm.
Figure 7D:
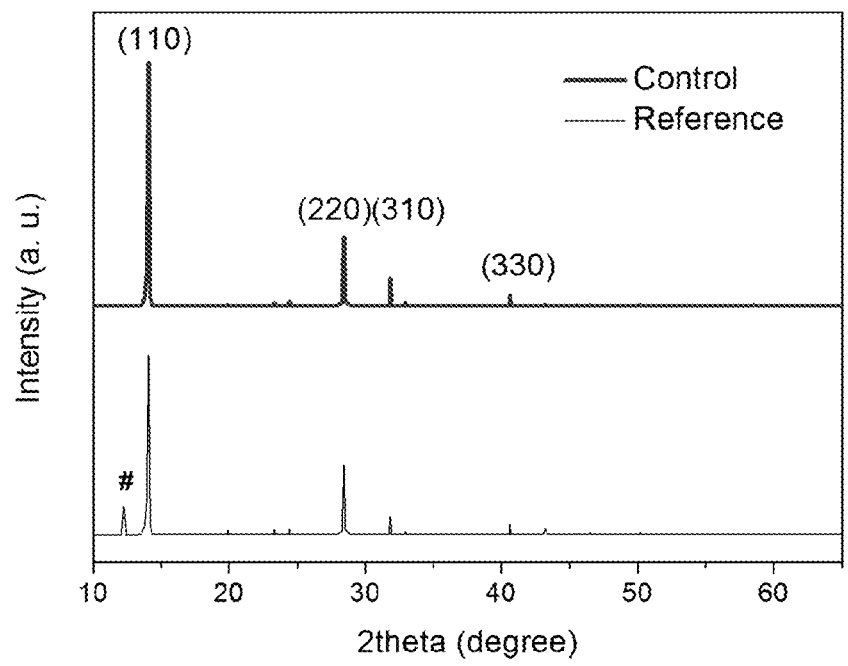
FIG. 7D shows X-ray diffraction spectra of perovskite thin films grown from the present approach and the conventional two-step method. Peak marked with # is assigned to the trace of PbI2.

The optical absorption curves of perovskite thin films were carried out as shown in FIG. 7C. To probe the difference between the present method and the conventional two-step method, samples prepared using $CH_3NH_3I$ and $PbI_2$ solution were also cast by spin coating. The absorption characteristics of perovskite thin films derived from different approaches present similar optical behaviors from ultraviolet to near infrared regions, except for the shape of the absorption edge. The corresponding X-ray diffraction patterns of samples were collected as shown in FIG. 7D, from which it can be seen that the films resulted from various fabrication processes are identical in their crystal structure. However, a weak peak centered at 12.24° (as # in Reference) can be detected in the film obtained from the conventional two-step method, which is attributed to $PbI_2$. The excessive $PbI_2$ could act as an insulating layer to reduce the photocurrent. It is well known that the phase purity can significantly affect device performance by increasing recombination in perovskite crystal lattice and correspondingly leading to a low shunt resistance, causing comprehensively degradation in device parameters including open-circuit voltage (VOC), short-circuit current density ($J_{SC}$) and fill factor (FF). The diffraction patterns confirm that present perovskite samples have the tetragonal crystal lattice parameter with a=b=8.87 Å and c=12.65 Å. Furthermore, differences were found in the photoluminescence spectra of the samples. The photoluminescence spectrum derived from the perovskite film obtained by the present method is slightly red-shifted compared to the perovskite film obtained by the conventional two-step method. The magnitude of shift might be correlated to the nature of internal structure. De Bastiani and co-workers have found that small perovskite crystallite leads to blue-shifted photoluminescence emission. The differences on absorption and photoluminescence are also likely related to the morphology of perovskite.

Morphology Evolution of Perovskite Thin Films.

Figure 3A:
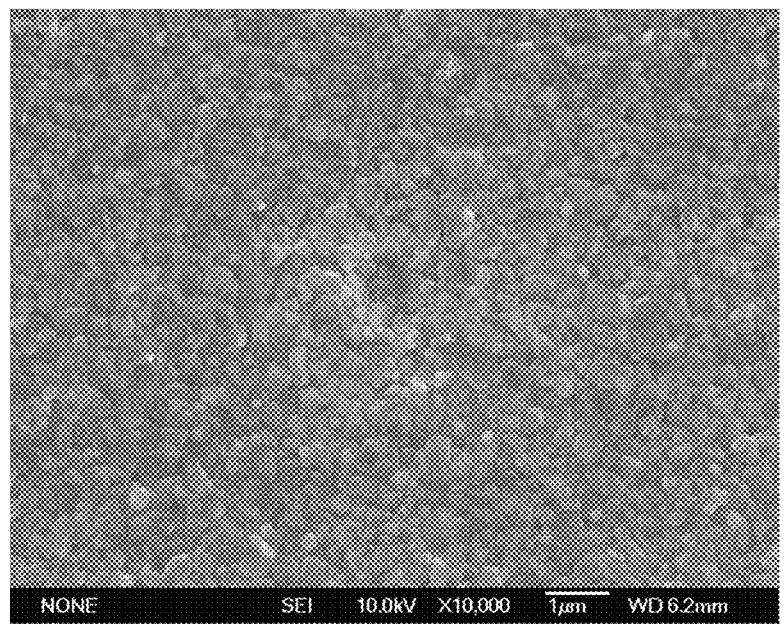
FIG. 3A shows the SEM images of perovskite ($CH_3NH_3PbI_3$) thin films prepared by the present method.
Figure 3B:
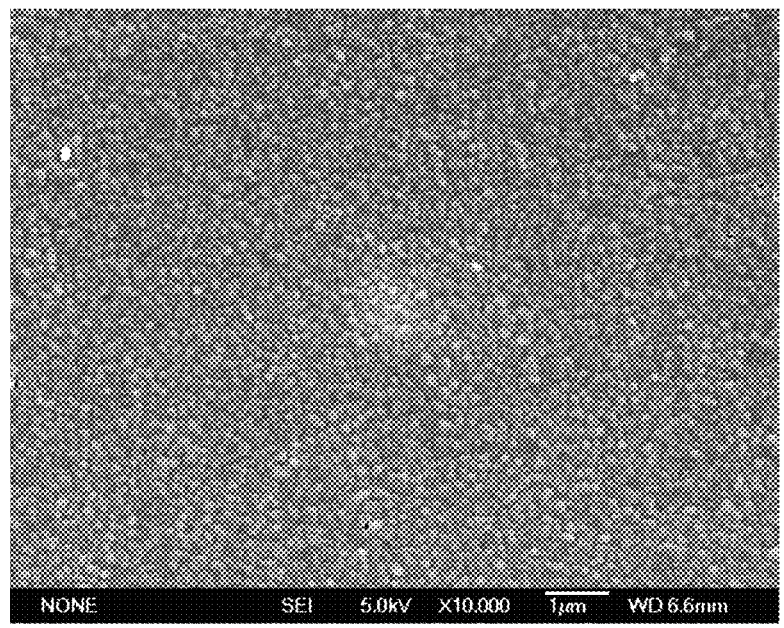
FIG. 3B shows the SEM images of perovskite ($CH_3NH_3PbI_3$) thin films prepared by prior art spin coating method. The average grain size of the former perovskite thin film (FIG. 3A) is significantly larger than the latter (FIG. 3B). The smaller grain size usually results in a higher grain boundary density. This high grain boundary density will affect the quasi-Fermi level splitting, and defects at grain boundaries, which can heavily reduce open-circuit voltage in perovskite solar cells due to trap filling of the photo-generated electrons and an accumulation of holes, and lead to the formation of barriers to extract carriers.
Figure 4:
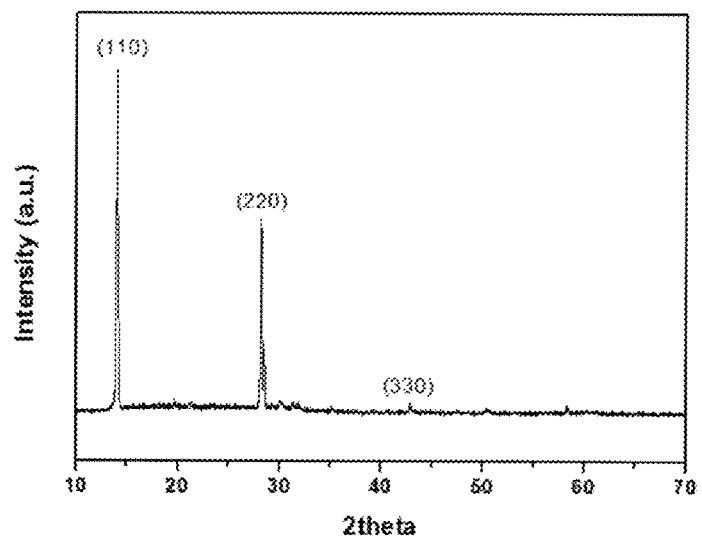
FIG. 4 shows the X-ray diffraction patterns of $CH_3NH_3PbI_3$ thin films obtained by the present method. The results show the sample has typical diffraction patterns, the peaks on 110, 220 and 330 are very obvious, which indicates the present sample has pure perovskite phase.
Figure 5:
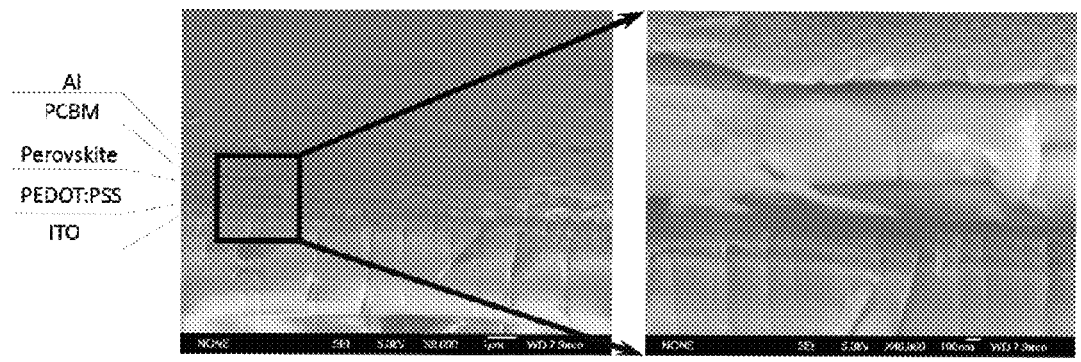
FIG. 5 shows the cross-section images of a perovskite solar cell fabricated by the present method. The corresponding device structure is labeled. It is clear that the perovskite solar cell has a layer-by-layer structure. From bottom to top, they are glass substrate (1.1 mm), a ~100 nm-thick indium tin oxide (ITO) coating, poly(3,4-ethylenedioxythiophene) polystyrene sulfonate (PEDOT:PSS), $CH_3NH_3PbI_3$, phenyl-C61-butyric acid methyl ester ($PC_{61}BM$), and aluminum.
Figure 7E:
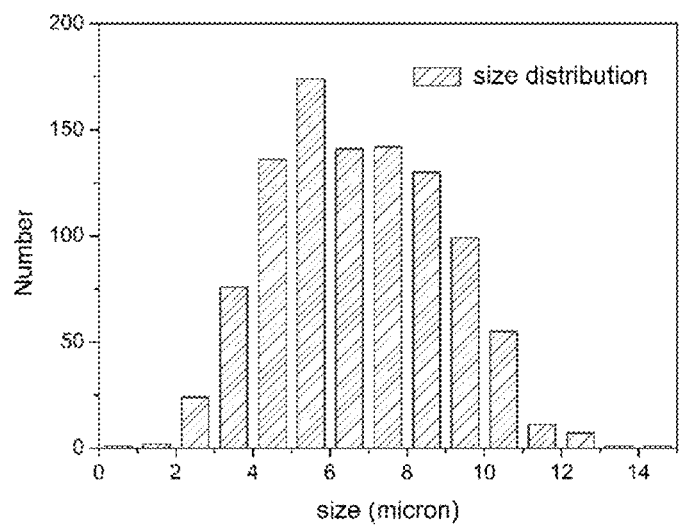
FIG. 7E shows size-distribution of perovskite grain growth using the present method. 1000 particles are chosen to plot this distribution.
Figure 9A:
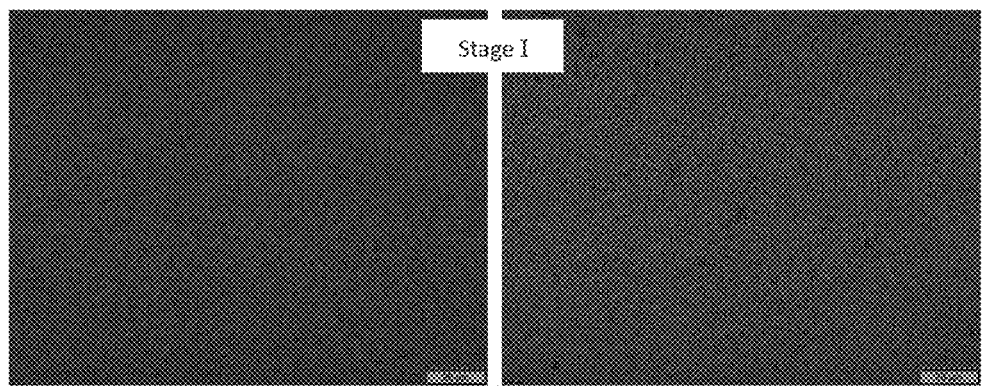
FIG. 9A shows morphological characteristic of the thin films for the as-cast (left) and the 30-minute treatment (right). After the treatment, the polycrystalline grains start to grow with a grain size of hundreds of nanometers to several microns.
Figure 9B:
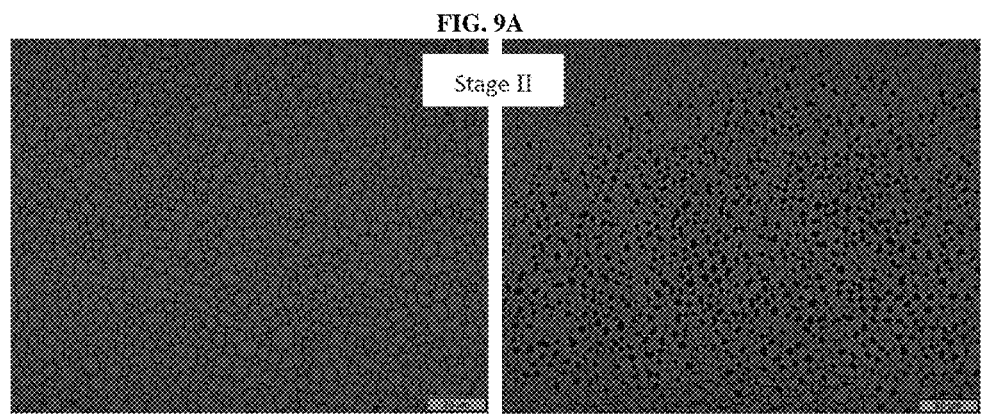
FIG. 9B shows images with different treatment time. The perovskite polycrystalline grains become maximum size (left) when the treatment time is around 1 hour to 1.5 hours. With the increase in time (around 4 hours), the cavities (right) begin to occur on the surface of the thin film.
Figure 9C:
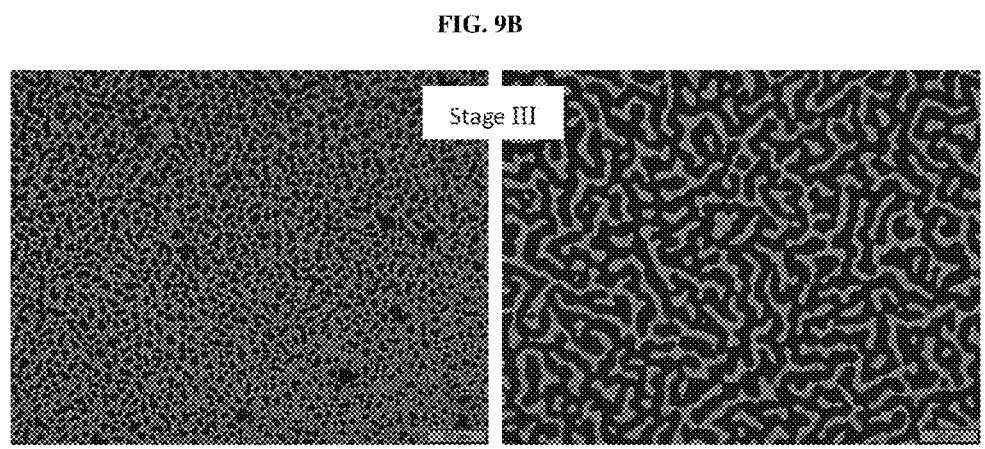
FIG. 9C shows distinct phase separation morphology (left) with a long treatment time (up to 10 hours), and the complete phase separation (right) occurs when the time reaches around 24 hours.
Figure 10:
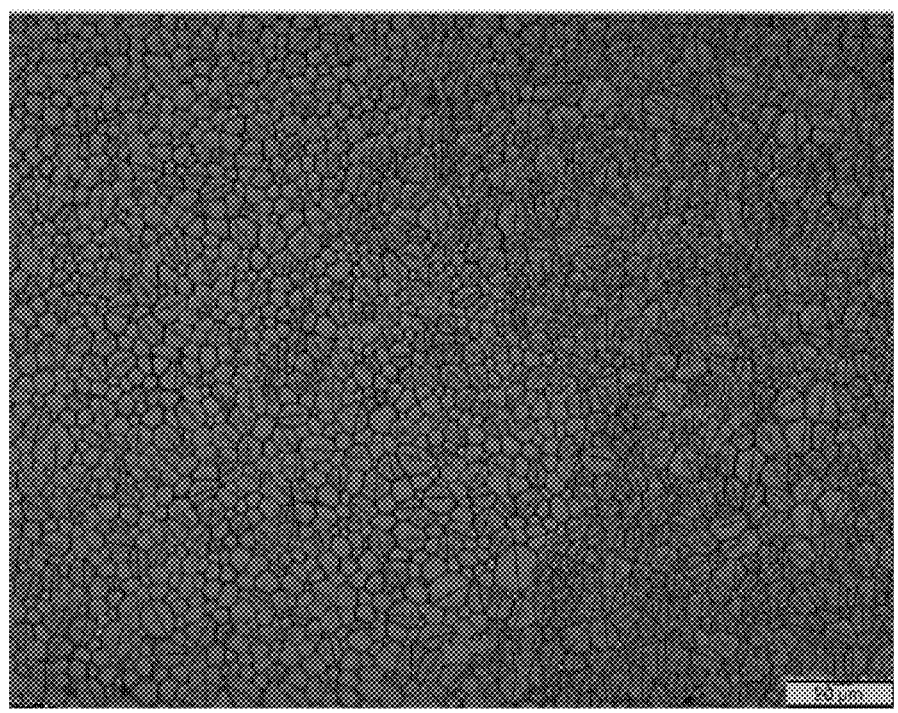
FIG. 10 shows size distribution profile of large polycrystalline grain of $CH_3NH_3PbI_3$. In this case, 1000 particles with different size are chosen to carry out the size distribution profile.
Figure 11:
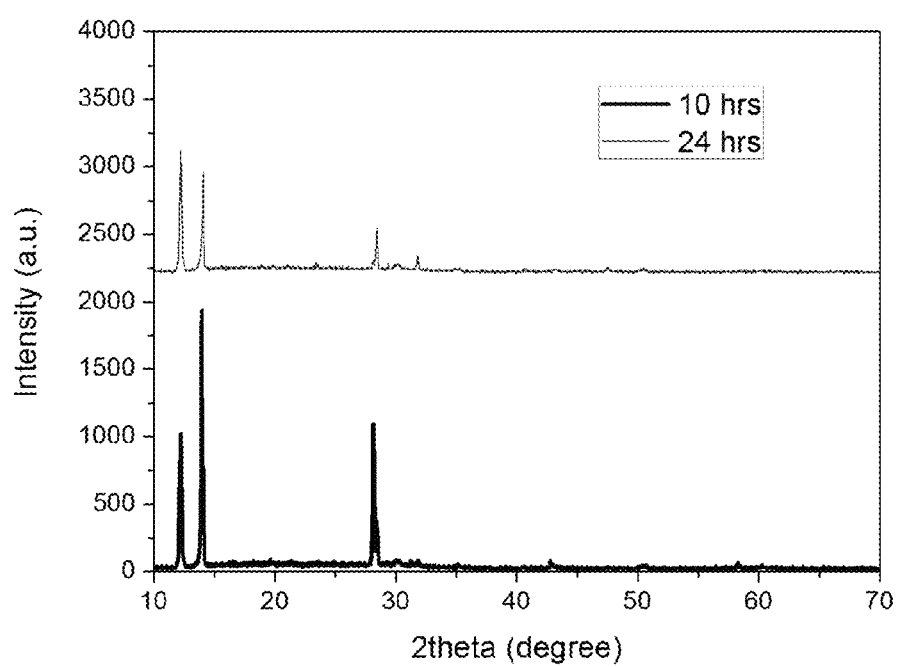
FIG. 11 shows XRD characteristics of perovskite thin films. XRD patterns of perovskite thin films with different treatment time. The trace located around 12.24 degree clearly indicates the decomposition of perovskite with long-time treatment.

By optical observation under controllable annealing, the evolution of film morphology transformed through three distinct stages, as evidenced via optical microscopy measurements (FIG. 9). At the first stage where the annealing time is below 30 min, the films gradually turned from grey to brown as a synergetic result of the removal of residual solvent in the film and immediately transformation of perovskite phase. Incomplete reacting species and intermediate phase are likely existing in the resulted composite at this stage of the reaction. The film morphology looks very uniform and continuous without any apparent pinholes on the surface. With the increase of annealing time, in the second stage (30-90 min total annealing time) the films became nut-brown and slightly transparent and the pure perovskite phase was observed, which is confirmed by the X-ray diffraction pattern. It means that full phase transformation occurred and intermediates vanished, leaving $CH_3NH_3PbI_3$ as the dominant phase. Unexpectedly, the film morphology thoroughly changed and clear crystalline grain boundaries appeared in this stage. The crystalline grain grows slowly, reaching maximum size in this stage which is on the order of a few microns to ~10 microns (FIG. 7E and FIG. 10). The possible reason for this morphology should be linked to the synergy of solvent vapor atmosphere and thermal annealing; the solvent vapor can improve the reconstruction process during $CH_3NH_3PbI_3$ transformation through dissolving the unreacted organic species and thermal annealing can accelerate the mass transport within the perovskite, resulting in the growth of the crystalline grain. As the treatment time increases, distinct microphase separation eventually occurs. The corresponding X-ray diffraction patterns of perovskite thin films with different treatment time clearly indicate the distinct degradation in the films, which can be evidenced from the trace of $PbI_2$ around 12.24° and the disappearance of characteristic peaks of perovskite (FIG. 11). As a comparison, the perovskite films were also fabricated using conventional two-step method and the corresponding scanning electron microscopy image was obtained as shown in FIG. 3B. It is clear that the average grain size of the film is much smaller than that of the sample obtained using the present method. In general, in this film the gap states and defects formed at the grain boundaries can greatly affect the quasi-Fermi level splitting and then reduce $V_{OC}$ owing to trap-filling of photo-generated electrons and accumulation of holes. As a result, this will give rise to the formation of barriers in the device which adversely affects efficient charge extraction. The large crystalline grain size (and hence low grain boundary density) of the proposed films are expected to facilitate photocurrent generation, transport and extraction.

Self-Consistent Optoelectronic Simulation.

Figure 12:
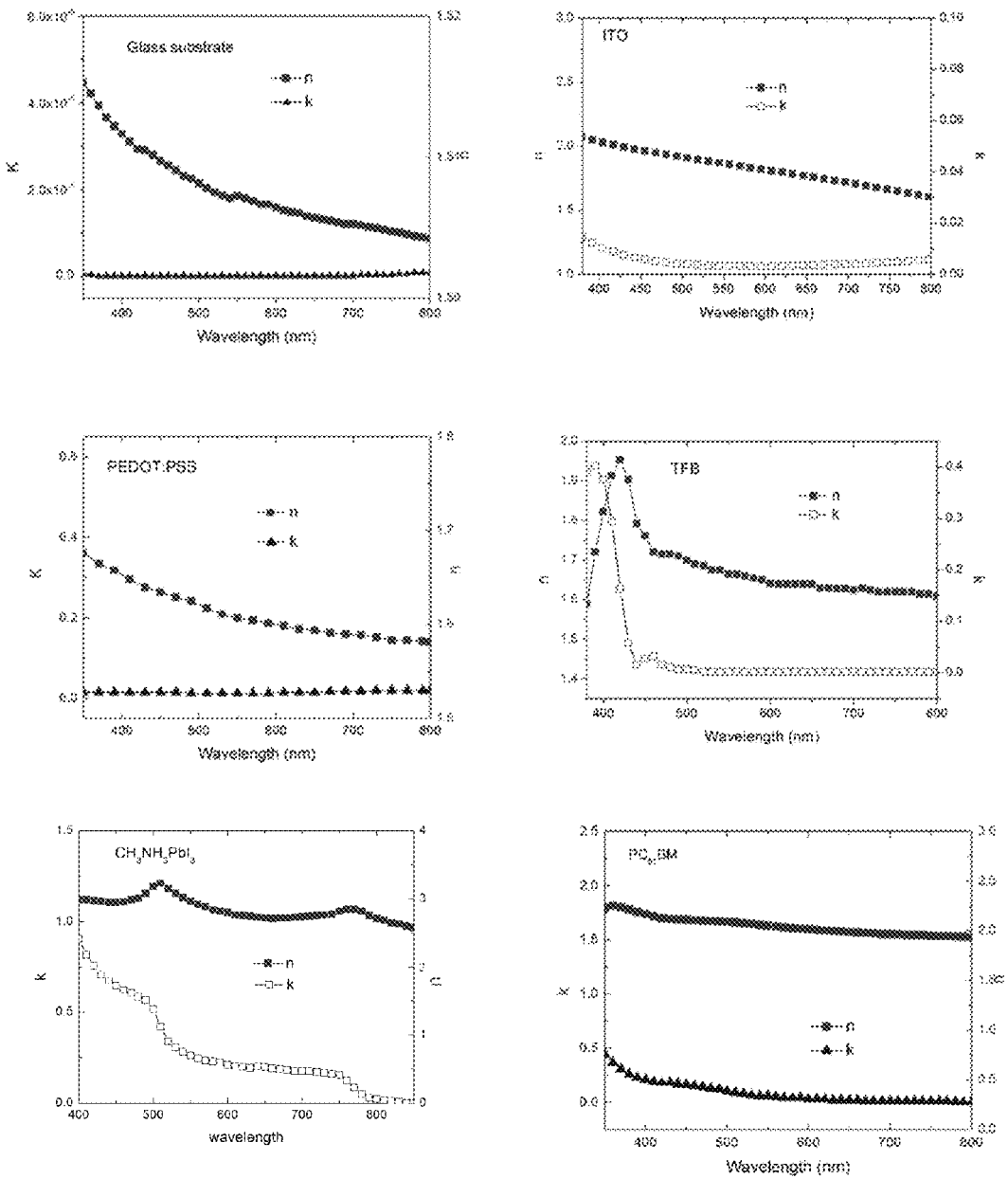
FIG. 12 shows optical constant of each functional layer used in this study. For the optical field distribution, the finite-difference time-domain method is employed to solve Maxwell's equations in complex geometries. The thickness and optical parameters of each functional layer are loaded into the model for the calculation of light intensity distribution across the solar cell device.

The optical field intensity profile distribution through finite-difference time-domain (FDTD) simulations (Lumerical Solutions, Inc.) was visualized for perovskite solar cells with varied photoactive layer thickness (200-1000 nm). The wavelength range used was 300-700 nm, and the illumination was from the ITO side. The optical field intensity at any given position in the device can be calculated with the optical constants (reflective index n and extinction coefficient k) and the thickness of each layer (FIG. 12). Therefore, the distribution of light intensity within the photoactive layer could be modulated through the optical interference between the incident light and light reflected from the metal electrode.

Figure 13A:
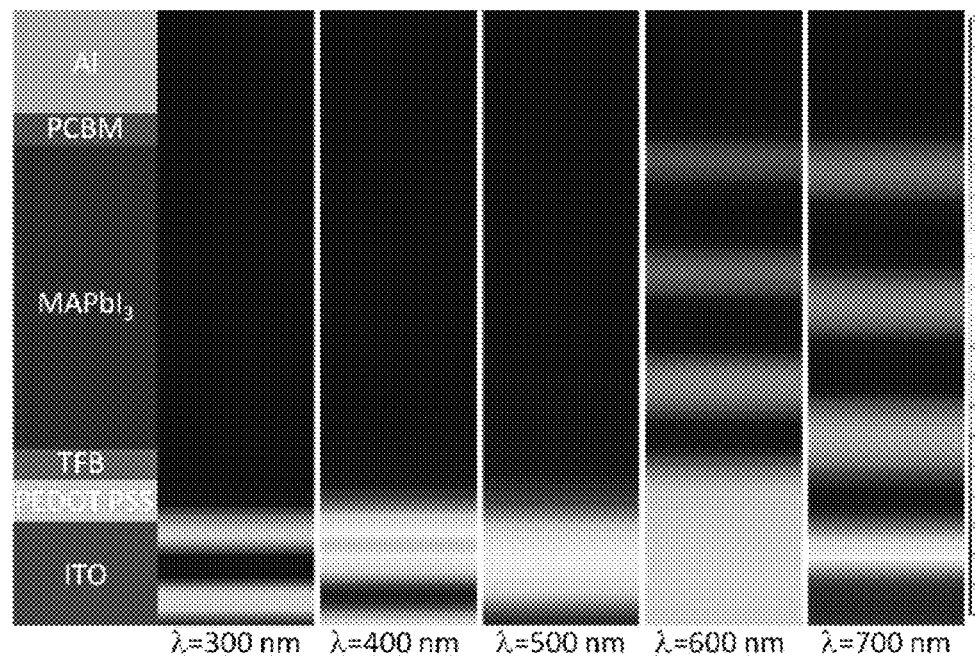
FIG. 13A shows visualized distribution profiles of spatially optical field intensity in $CH_3NH_3PbI_3$-based perovskite device with TFB as interfacial layer for five different incident wavelengths. The monochromatic light is normally incidence from the interface between glass and ITO. From left to right the incident wavelength is 300, 400, 500, 600, 700 nm, respectively, the bottom represents the ITO side and the top indicates the aluminum contact electrode. In this case, the photoactive layer thickness is 350 nm.
Figure 14:
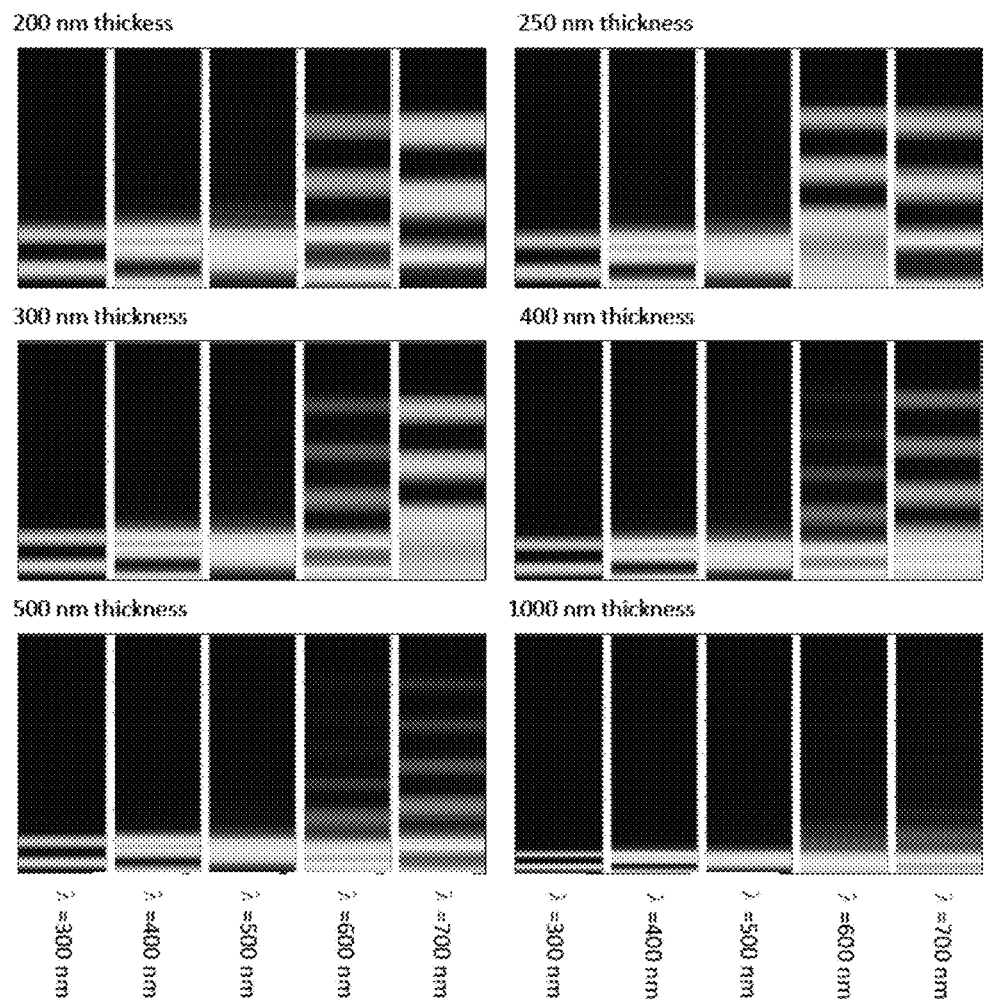
FIG. 14 shows visualized distribution profiles of spatially optical field intensity in $CH_3NH_3PbI_3$-based perovskite device (glass/ITO/PEDOT:PSS/TFB/$CH_3NH_3PbI_3$/PCBM/Al) with TFB as interfacial layer for five different incident wavelength. The monochromatic light is normally incidence from the interface between glass and ITO, and the bottom represents the ITO side and the top indicates the aluminum contact electrode.
Figure 15:
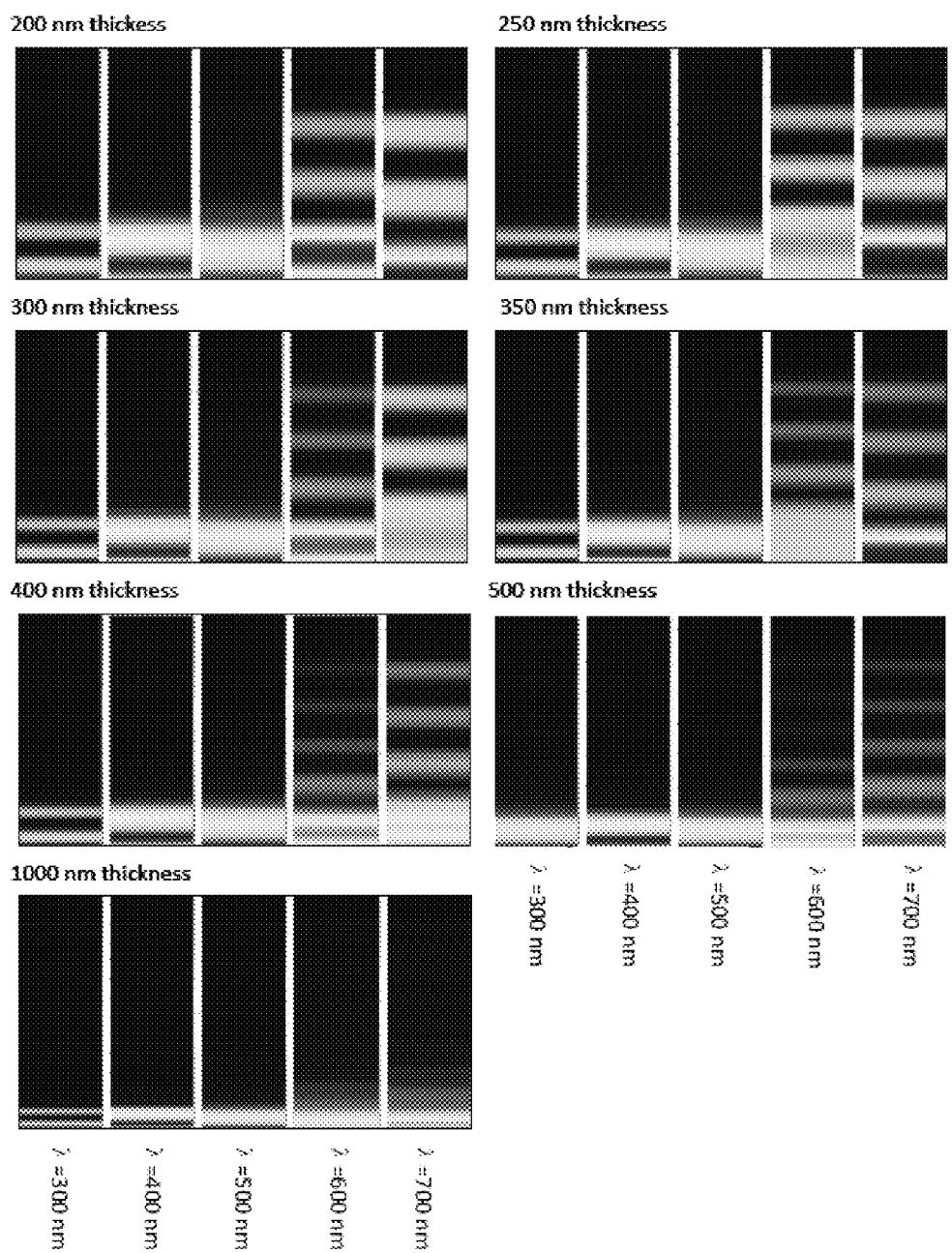
FIG. 15 shows spatially optical field intensity in $CH_3NH_3PbI_3$-based perovskite devices (Glass/ITO/PEDOT:PSS/$CH_3NH_3PbI_3$/PCBM/Al) without TFB as interfacial layer. Similarly, the monochromatic light is normally incidence from the interface between glass and ITO, and the bottom represents the ITO side and the top indicates the aluminum contact electrode.

As shown in FIG. 13A and FIG. 14-15, it is found that the inserted TFB does not act as an optical spacer, which suggests negligible influence on optical field distribution. For all cases involved, it can be clearly observed that the spatial distribution of the optical field intensity is strongly dependent on the thickness of the photoactive layer. There are three important features, which should be highlighted. Firstly, the optical behavior is in accordance with the Bouguer-Lambert-Beer Law for short wavelength (less than 400 nm). Secondly, the number of optical interference peaks increases with the photoactive layer thickness for incident light wavelength ≥600 nm. For 1000 nm photoactive layers, there are as many as 8 interference peaks in the active region. Finally, for photoactive layer thickness ≥350 nm, the interference peaks exist only when incident light wavelength ≥600 nm. In the case of a thinner active layer, the low-finesse peaks still reside for 500 nm wavelength of incident light (FIG. 14-15). Present simulation results indicate that the spatial distribution of light field intensity should be precisely regulated in operating devices, which can vitally impact the photon harvest and hence the external quantum efficiency of the devices.

Figure 13B:
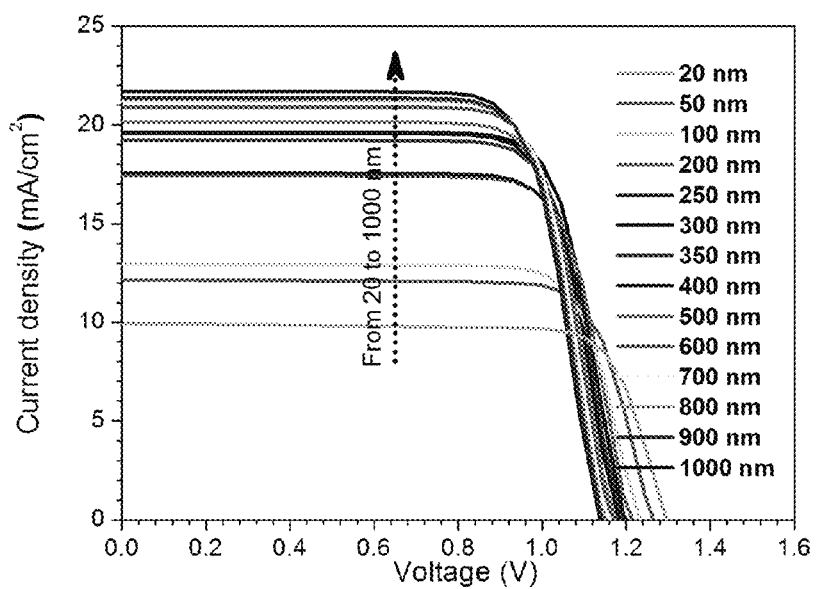
FIG. 13B shows simulated current density-voltage curves with various photoactive layer thicknesses from 20 to 1000 nm for the perovskite solar cells. Note that the open-circuit voltage in the reference devices with only PEDOT:PSS as hole transport layer is obviously lower than that in the devices with PEDOT:PSS/TFB as hole transport layer. It clearly demonstrates that TFB with more favorable HOMO level is effective for improving the open-circuit voltage in the present devices.
Figure 16:
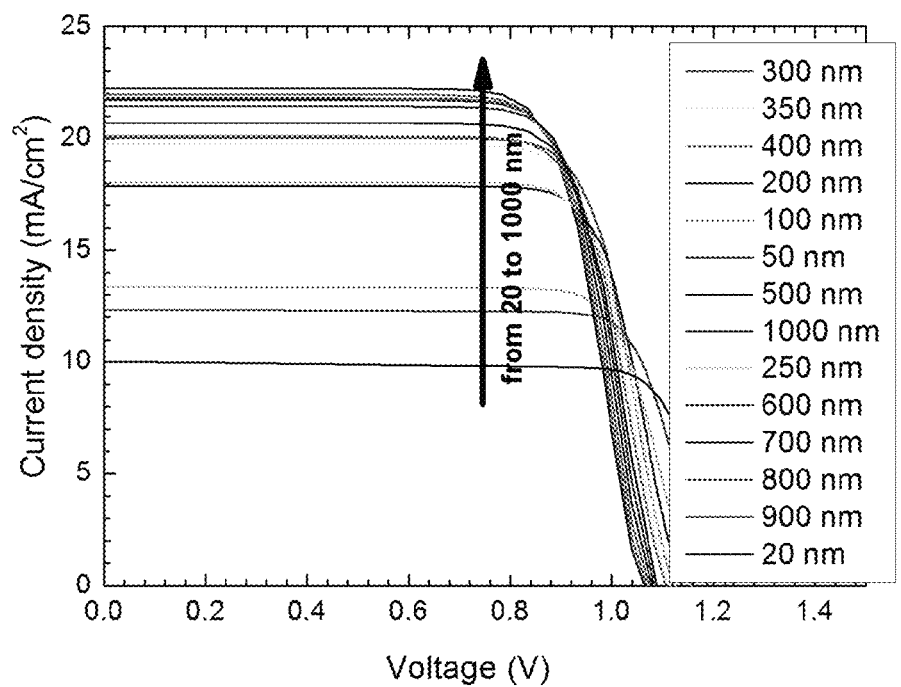
FIG. 16 shows simulated J-V curves and related properties. The electrical simulation of the perovskite solar cells without TFB as hole transport layer. The basic parameters such as $V_{OC}$, FF and $J_{SC}$ have similar variation trend with those from the devices with TFB as interfacial layer.
Figure 16:
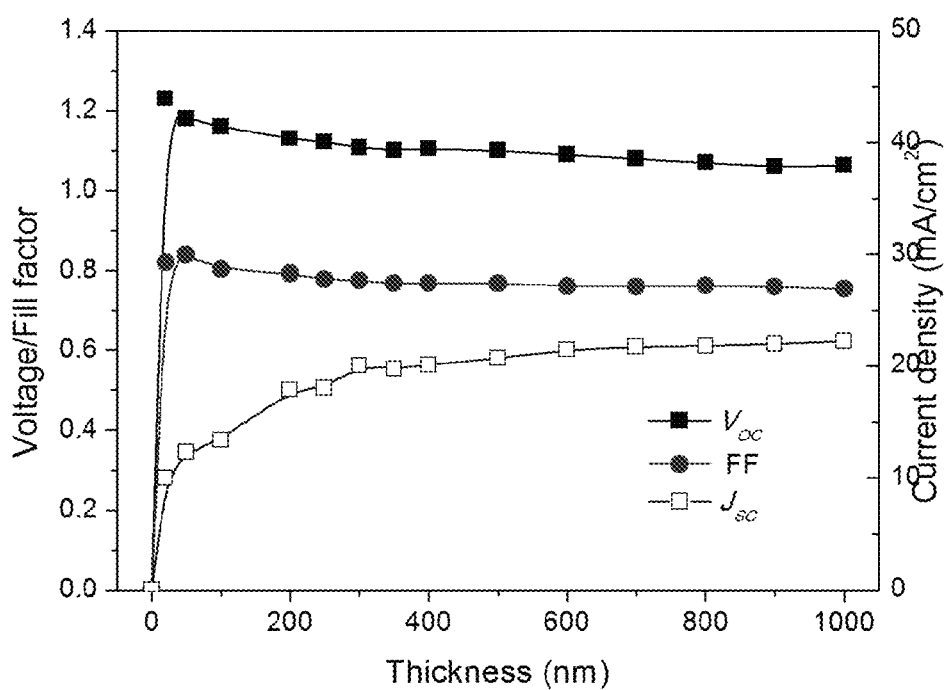

Based on these optical behaviors, using the commercial APSYS package (Crosslight Inc.), the current density-voltage characteristics of the perovskite solar cells with different photoactive layer thicknesses were simulated under standard AM 1.5G solar illumination. This self-consistent optoelectronic simulation primarily involves solving Maxwell, Poisson, and charge drift-diffusion equations, which can reasonably support the assumption of improved material quality for large grains in the present case. By means of material characteristic parameters, the model quantitatively produces all the prominent features of the current density-voltage (J-V) plots. With the progressive increase of photoactive layer thickness, the photocurrent gradually increases due to the more sufficient absorption by $CH_3NH_3PbI_3$. However, the saturated current density occurs when the photoactive layer thickness reaches 350 nm (FIGS. 13A and 13B). With the continuous increase of thickness, the photocurrent and fill factor tend to become saturated. The similar tendency is also found in the devices without TFB interfacial layer, as shown in FIG. 16. It is comprehensible that for the present fabrication process, the perovskite film quality becomes compromised when its thickness is thicker than 350 nm, which should be the result of shorting defects deriving from large crystals. Hence, it can be concluded that in an operating device, the optimized photoactive layer should be around ~350 nm from this thickness-dependent relationship. In general, the interfacial effects are very difficult to be quantitatively analyzed in optoelectronic model. On the other hand, it is known that the morphology of photoactive layer plays crucial role in determining the series and shunt resistances that directly affect fill factor and corresponding device efficiency. Therefore, the realizable fill factor will depend on both interfacial engineering and morphological control in the device. Similarly, it seems that the high open-circuit voltage in the present simulation results from the idealized assumption in the model which does not take into account the passivation and non-radiative losses within the polycrystalline perovskite layer. Grätzel et al. have demonstrated that the limit for open-circuit voltage in the case of solely radiative recombination is around 1.3 V, which is in good agreement with the present self-consistent simulation. Nevertheless, very low non-radiative losses can decrease this value to around 1.0 V for the state-of-the-art devices. Furthermore, imperfect passivation is another factor in affecting the practical value.

Figure 13C:
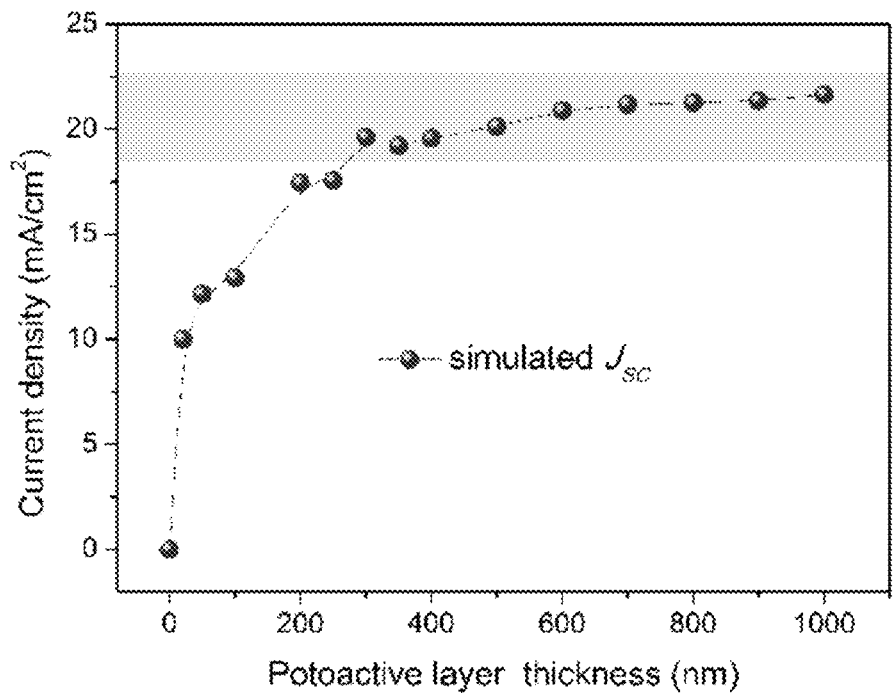
FIG. 13C shows the relationship of current density versus photoactive layer thickness. The values of current density become saturated when the $CH_3NH_3PbI_3$ layer thickness is higher than 350 nm.
Figure 13D:
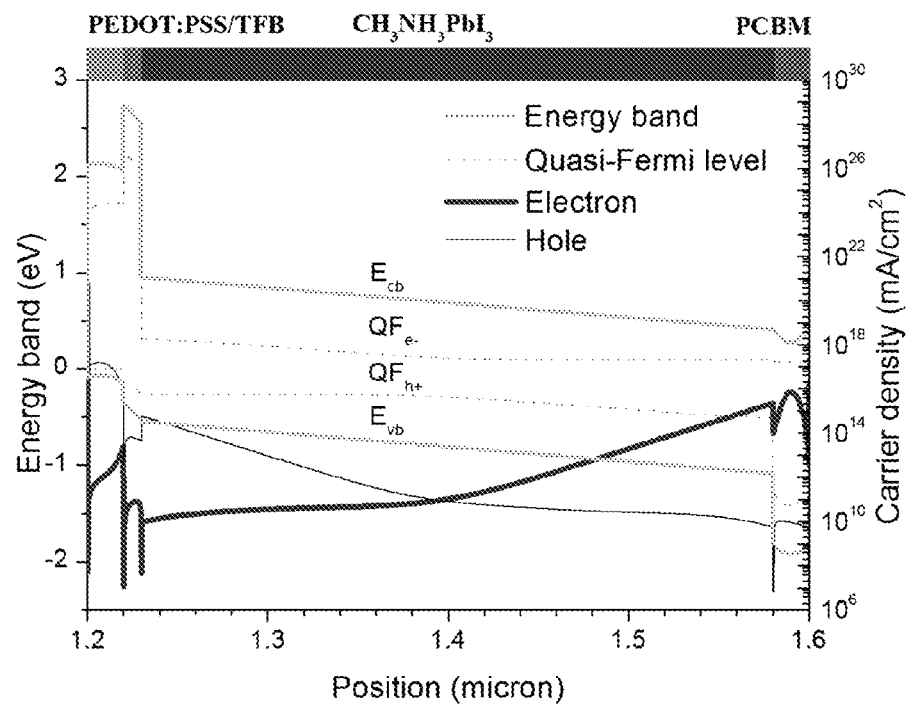
FIG. 13D shows carrier density profiles and energy band diagram under short circuit condition across all regions of the perovskite solar cells.

The typical energy band diagram and carrier density profiles in all regions of the device were simulated (FIG. 13C), which were collected when the device is under AM 1.5G illumination. The present results clearly indicate that the photoactive region is almost fully depleted, which conducts the photo-generated charge carriers to their respective electrodes. Otherwise, the recombination of generated charge carriers would happen in the field-free regions. In the present case, the built-in electrical field is expected to allow efficient charge collection.

Solar-Cell Performance.

Figure 17A:
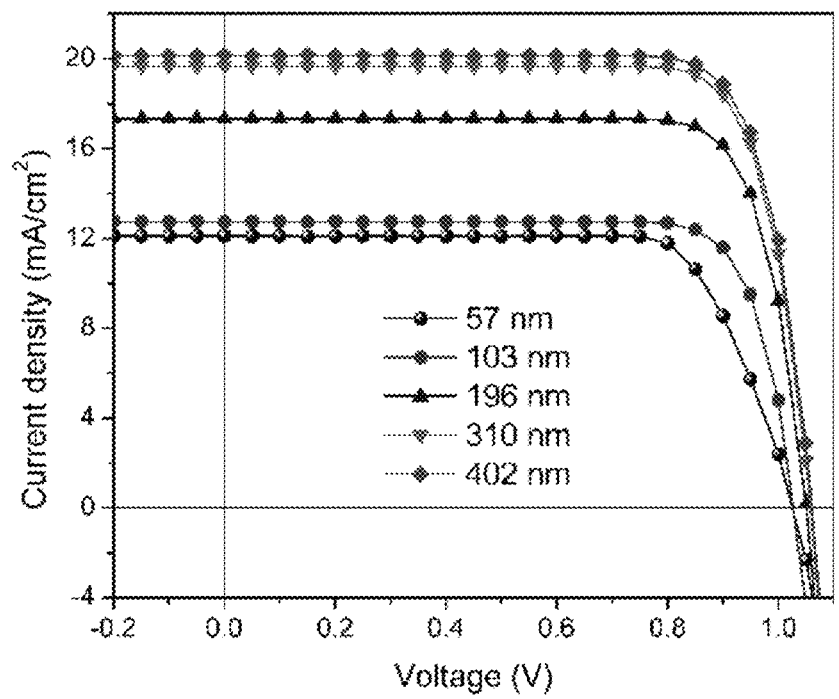
FIG. 17A shows current density-voltage curves of perovskite solar cells with different photoactive layer thickness under AM 1.5G illumination.
Figure 17B:
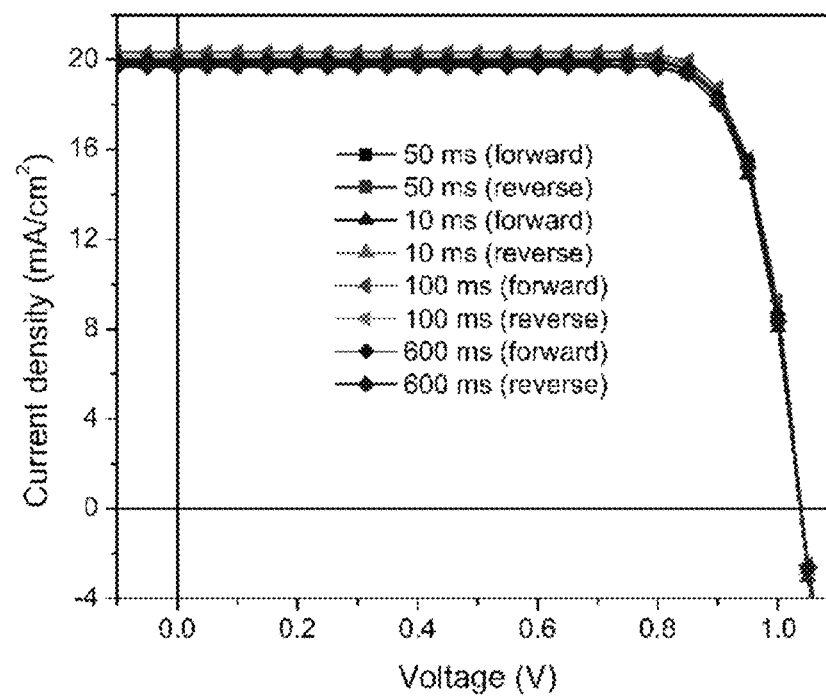
FIG. 17B shows device performance resulted by sweeping the voltage from forward to reverse and from reverse to forward applied voltage indicates the negligible hysteresis behaviors, furthermore, the curves with different scan rates from 10 to 600 millisecond also demonstrate the absence of hysteresis in the present devices.
Figure 17C:
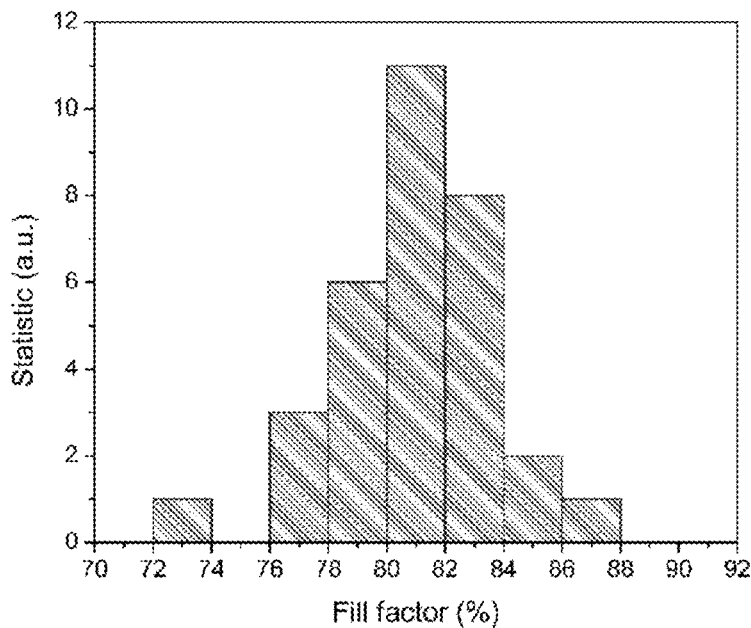
FIG. 17C shows distribution profile of fill factor for 32 measure devices, illuminating the robust process with high reproducibility.
Figure 17D:
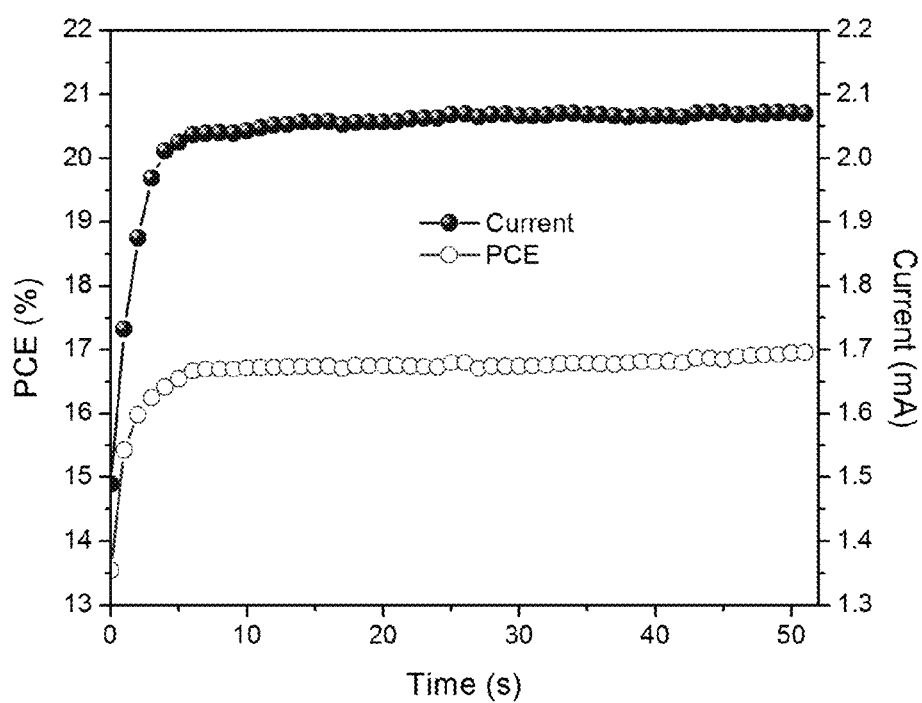
FIG. 17D shows the characteristics of maximum power output. The power output behavior is carried out under loading around the maximum power output point.

Making use of the micron-sized grains, planar heterojunction perovskite solar cells were fabricated. The J-V curves for devices fabricated with various thicknesses of photoactive layer are shown in FIG. 17A. The measurements were under standard AM 1.5G illumination of 100 mW/cm$^2$, which was calibrated using a NREL-certified monocrystalline Si solar cell. During measurement, a mask was employed to define the effective area of illumination in order to avoid lateral effects. As shown in FIG. 17A, it is clear that the values of current density in operating devices substantially increase with the thickness of photoactive layer, which has similar variation tendency with the present self-consistent electrical simulation. Recently, the photocurrent hysteresis phenomenon in perovskite photovoltaic has become an inevitable scientific concern. Though the origin of this hysteresis is still debatable, one proven method to alleviate or eliminate the J-V hysteresis is by applying perovskites with high crystalline quality and purity. Another effective method for fabricating hysteresis-free devices is passivation of the perovskite layer by fullerene (PCBM etc). Accordingly, in the present case it is expected that the planar perovskite hybrid solar cells with large-size grain and perfect fullerene passivation will lead to small hysteresis or hysteresis-free with respect to scan direction and scan rate. In order to avoid variations in optical absorption or interference effects owing to different film thickness, an optimized perovskite layer thickness was used in the present study. As shown in FIG. 17B, it can be seen that the perovskite solar cell was hysteresis-free with negligible variation regardless of the direction of voltage sweep or the scan rate. Apart from being hysteresis-free, it can be seen in FIG. 17C that the present devices exhibit outstanding fill factor tolerance and high degree of reproducibility in the overall PCE. It should be noted that the champion fill factor (87.3%) in the present experiment is of record high for perovskite solar cells with different device architectures. It is even fully comparable with other state-of-the-art inorganic photovoltaic devices such as silicon and copper indium gallium selenide solar cells. The stabilized power output behavior under loading around the maximum power output point was characterized, which is the best means to check the stabilization of possible hysteresis. The corresponding stabilized power output of the cell is shown in FIG. 17D, exhibiting a PCE of ~16.7%, which is 98% of the initial value regardless of scan direction and rate. Clearly, the device performance resulted by sweeping the voltage from forward to reverse and from reverse to forward applied voltage is relatively stable, and the maximum power output is high, indicating that the proposed route has a high stabilized power output and the passivation of large-size perovskite grains is desirable on reducing the impact of hysteresis.

Figure 6A:
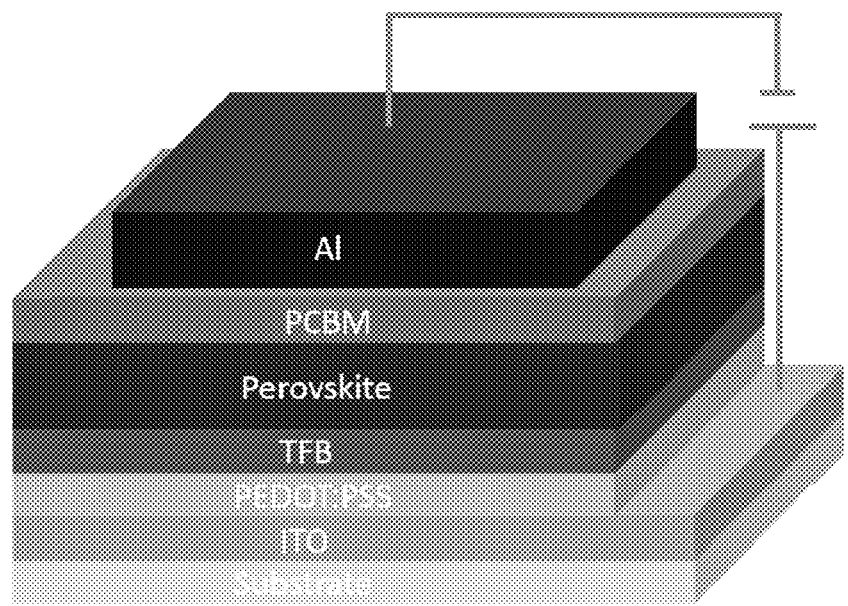
FIG. 6A shows a schematic diagram of a device architecture.
Figure 6B:
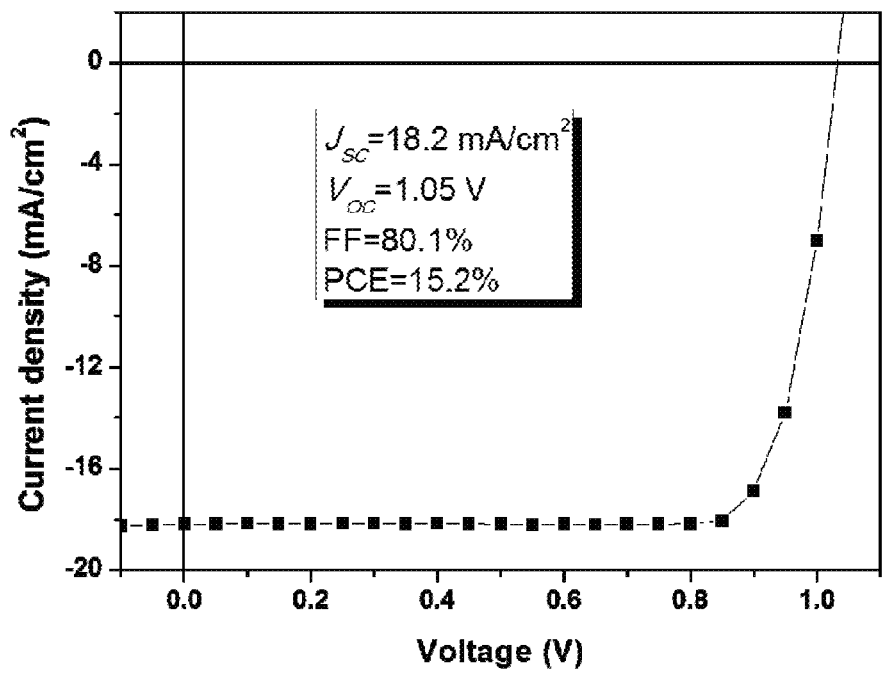
FIG. 6B shows a current density-voltage curve of a perovskite solar cell prepared by prior art spin coating method.
Figure 6C:
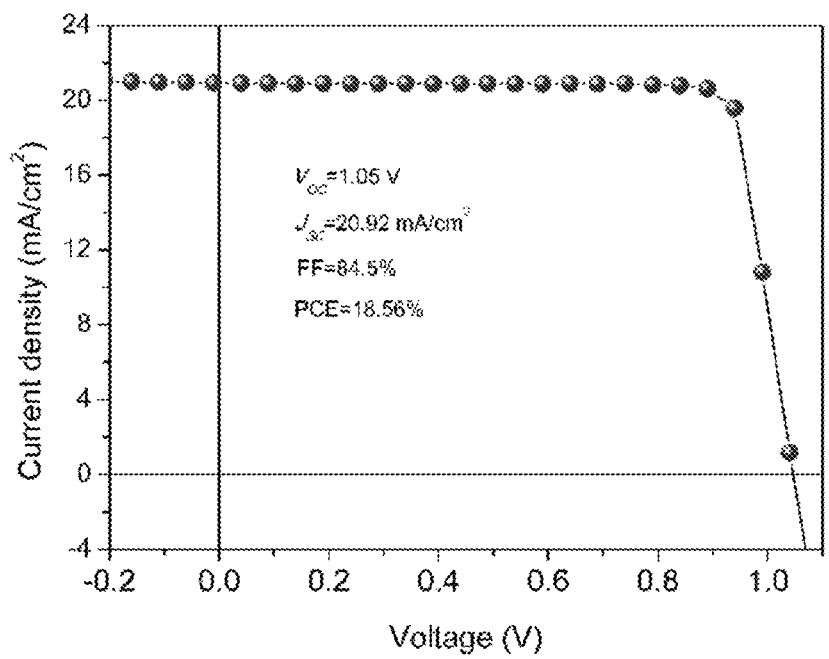
FIG. 6C shows a current density-voltage curve of a perovskite solar cell prepared by the present method.
Figure 6D:
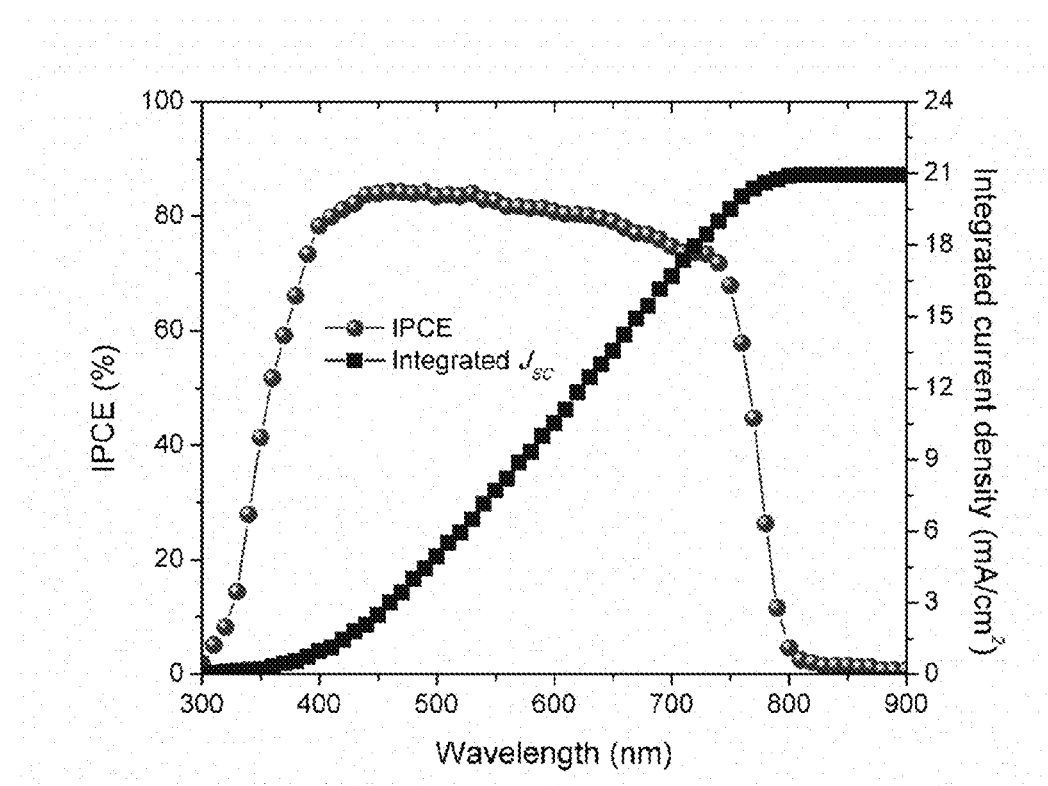
FIG. 6D shows the corresponding external quantum efficiency (EQE) curve and its integrated product with the AM 1.5G photon flux. The device architecture is glass (1.1 mm)/ITO (~100 nm)/PEDOT:PSS (~20 nm)/Poly[(9,9-dioctylfluorenyl-2,7-diyl)-co-(4,4'-(N-(4-sec-butylphenyl)diphenylamine)] (TFB) (~10 nm)/$CH_3NH_3PbI_3$ (~330 nm)/($PC_{61}BM$) (~20 nm)/Aluminum (100 nm). The device prepared using the present method shows comprehensive enhancement on device performance parameters. Apart from the same open-circuit voltage (~1.05 V), the short-circuit current density (20.92 $mA/cm^2$ Vs. 18.2 $mA/cm^2$) and fill factor (84.5% Vs. 80.1%) in the device based on the present method are higher than those from the device fabricated with conventional spin coating method. The former device performance (PCE: 18.56% Vs. 15.2%) clearly demonstrates that the present approach is more suitable for fabricating high quality perovskite thin films for optoelectronics.
Figure 18:
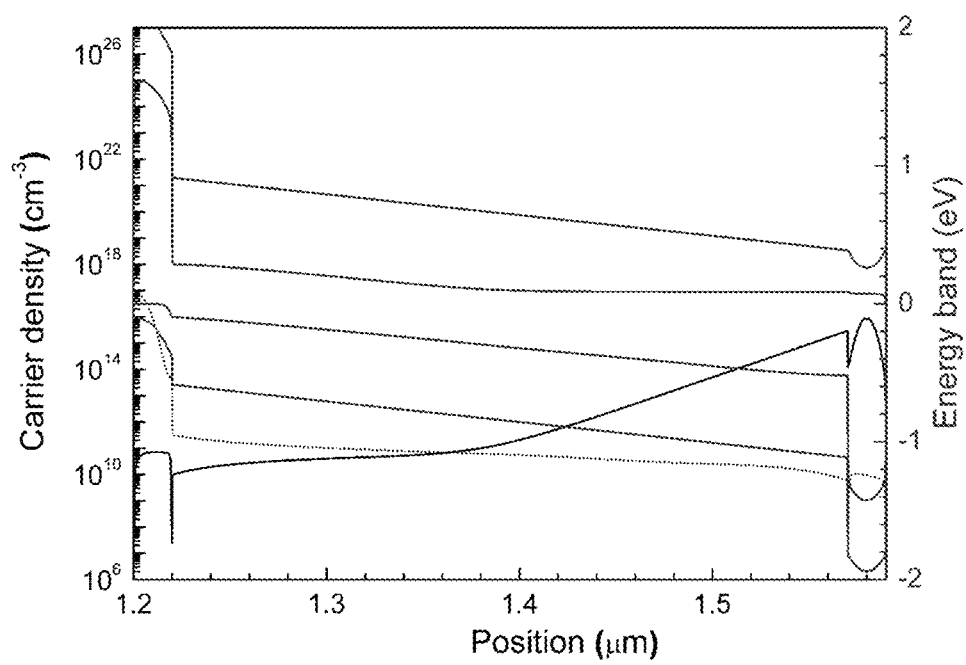
FIG. 18 shows simulated energy band profiles and carrier density characteristics across the device (Glass/ITO/PEDOT:PSS/$CH_3NH_3PbI_3$/PCBM/Al) without TFB as interfacial layer under short circuit condition.

FIG. 6C shows the J-V curve for the present device under simulated AM 1.5G condition with a PCE of 18.56%, FF=84.5, $V_{OC}$=1.05 V and $J_{SC}$=20.92 mA/cm$_2$. This result is by far among the highest efficiencies for all perovskite-only cells reported. For comparison, the device fabricated using the conventional two-step method was also carried out, which exhibits a PCE of only 15.2% (FIG. 18). Recently, several research groups have observed severe J-V hysteresis phenomena in mesoporous-based and planar heterojunction perovskite solar cells, which makes accurate efficiency measurement debatable and hinders the endeavor for promoting their practical application. As demonstrated above, hysteresis-free performance over a range of J-V scan directions and rates with high efficiency was achieved, demonstrating the feasibility for future industrialization. It was identified that the $J_{SC}$ measured from the device was in good agreement with the integrated value of EQE data and the AM 1.5G solar spectrum (FIG. 6D).

DISCUSSION

Figure 6E:
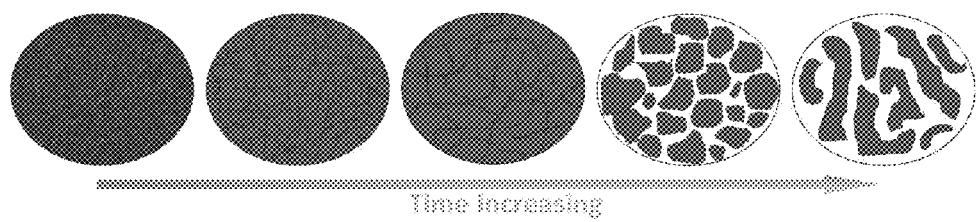
FIG. 6E shows the schematic for the morphology control. After the spin coating process the solvent evaporation is not thoroughly completed. After pretreatment by thermal annealing the $CH_3NH_3PbI_3$ thin film becomes brown-red. Under the interaction of thermal annealing and solvent vapor, polycrystalline perovskite grains begin to grow. With increase in time, the perovskite crystalline grains achieve their maximum size that is in the region of several microns; finally, microphase separation occurs with island-like morphology.

It is herein introduced a new route combining vacuum and solution processes to create and control perovskite morphology, which can be regulated over a large range of time scale and results in micron-size crystallization grains and more uniform thin-film formation. As an example, the schematic diagram of morphology evolution of photoactive perovskite thin film is illustrated in FIG. 6E. It is the first time to observe the interesting evolutionary process for non-chlorine $CH_3NH_3PbI_3$ under low temperature. By ruling out the effect of spin coating $PbI_2$ solution and employing more uniform thermally evaporated film (FIG. 8), high-purity-phase perovskite with large grain size from a few to ~10 microns were realized under a synergetic process of solvent vapor and thermal annealing. Present findings indicate that the morphology revolution of $CH_3NH_3PbI_3$ perovskite can be precisely regulated in analogy to polymer solar cells, where the importance of morphology optimization on improving device performance has been confirmed previously.

Figure 13E:
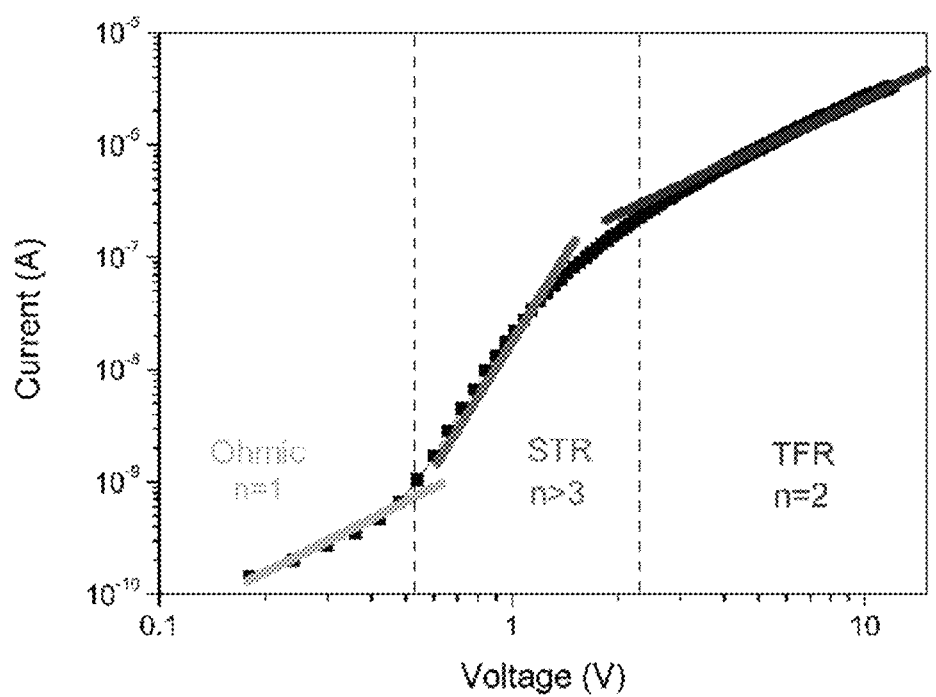
FIG. 13E shows current-voltage curve for $CH_3NH_3PbI_3$-based hole-only device derived from the space-charge-limited current method. The STR and TFR indicate space trapping region and trap-free region, respectively. Because this method measures the mobility perpendicular to the electrodes, the measured mobility is more relevant to solar cells. The typically three-region curve with different slopes is plotted.

Proceeding to explore the influence of large-size grain on the transport properties of the perovskite films, charge carrier mobility was determined using space charge-limited current method (FIG. 13E). In order to identify the actual influence of films under real device operating conditions, the films were fabricated using optimized annealing time. Carrier mobility of 72 cm$^2$ V$^{-1}$ s$^{-1}$ was obtained, which is slightly higher than that of the previous study using the conventional two-step method. Correspondingly, carrier diffusion length of 361 nm was calculated by $L_D=(\kappa_B T\mu\tau/e)^{1/2}$_{27}. This value is obviously higher than the typically reported value ~100 nm in $CH_3NH_3PbI_3$-based materials. It is also slightly larger than the photoactive layer thickness (~350 nm) in devices, indicating that the charges generated in perovskite films could reach the surface with negligible loss. The 7.07×10$^{15}$ cm$^{-3}$ charge trap-state density of the film was also determined and was found to be much higher than single crystal (~3.6×10$^{10}$ cm$^{-3}$). However, this result is approximately one order of magnitude lower than typical polycrystalline (5×10$^{16}$ cm$^{-3}$) perovskite films. Generally, the overall charge recombination in the devices is dominated by the surface recombination while the interface charge recombination is mainly determined by the surface trap density. The charge recombination at the surfaces of perovskite can significantly reduce the charge extraction efficiency. Undoubtedly, benefiting from the favorite grain boundaries and low trap-state density, the energy barrier between grain domains will be reduced, which facilitates the charge transport within the perovskite. Also, the interface charge recombination can be effectively restrained, which can obviously boost the device $J_{SC}$ and FF and corresponding PCE.

In summary, applying a hybrid process of combining vacuum and solution-processed technologies, it has been demonstrated a new approach for fabricating photoactive layers for high-efficiency planar heterojunction perovskite solar cells. For the first time, it is observed the morphology evolution of micron-scale large-size perovskite grains in perovskite thin films, which can be easily regulated on a large time scale. Assisted by drift-diffusion and Poisson equations along with the transfer-matrix solution, the self-consistent optoelectronic simulation is carried out to predict the optimized photoactive layer thickness and spatial optical field redistribution profiles, which are in good agreement with the present experimental results. The large grain perovskite films resulted from the present hybrid approach enjoyed along carrier diffusion length and low charge trap-state density, which substantially support the superior device performance. With the device engineering by the introduction of polymer TFB as hole transport layer, the present device has achieved a hysteresis-free PCE of 18.56% with a $V_{OC}$ of 1.05 V, a $J_{SC}$ of 20.92 mA/cm² and a FF of 84.5%. This is by far one of the highest efficiency cells reported for $CH_3NH_3PbI_3$-only solar cell without any additives. Furthermore, the FF value of 87.3% is the best result for perovskite solar cells. Further improvement in efficiency can be expected by optimizing the photoactive layer morphology and device interfacial engineering. More importantly, for perovskite solar cells to early meet commercial requirements in global photovoltaic community, this proposed technology is expected to provide a viable route for the fabrication of high-efficiency large-area device modules.

By "comprising" it is meant including, but not limited to, whatever follows the word "comprising". Thus, use of the term "comprising" indicates that the listed elements are required or mandatory, but that other elements are optional and may or may not be present.

By "consisting of" is meant including, and limited to, whatever follows the phrase "consisting of". Thus, the phrase "consisting of" indicates that the listed elements are required or mandatory, and that no other elements may be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

By "about" in relation to a given numerical value, such as for temperature and period of time, it is meant to include numerical values within 10% of the specified value.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

REFERENCES

1. Lee, M. M., Teuscher, J., Miyasaka, T., Murakami, T. N. & Snaith, H. J. Efficient hybrid solar cells based on meso-superstructured organometal halide perovskites. Science 338, 643-647 (2012).
2. Kim, H.-S. et al. Lead iodide perovskite sensitized all-solid-state submicron thin film mesoscopic solar cell with efficiency exceeding 9%. Sci. Rep. 2, 591 (2012).
3. Heo, J. H. et al. Efficient inorganic-organic hybrid heterojunction solar cells containing perovskite compound and polymeric hole conductors. Nat. Photon 7, 486-491 (2013).
4. Burschka, J. et al. Sequential deposition as a route to high-performance perovskite-sensitized solar cells. Nature 499, 316-319 (2013).
5. Liu, M., Johnston, M. B. & Snaith, H. J. Efficient planar heterojunction perovskite solar cells by vapour deposition. Nature 501, 395-398 (2013).
6. Malinkiewicz, O. et al. Perovskite solar cells employing organic charge transport layers. Nat. Photon 8, 128-132 (2014).
7. Liu, D. & Kelly, T. L. Perovskite solar cells with a planar heterojunction structure prepared using room-temperature solution processing techniques. Nat. Photon 8, 133-138 (2014).
8. Jeon, N. J. et al. Solvent engineering for high-performance inorganic-organic hybrid perovskite solar cells. Nat. Mater. 13, 897-903 (2014).
9. Hodes, G. Perovskite-based solar cells. Science 342, 317-318 (2013).
10. Chen, Q. et al. Planar heterojunction perovskite solar cells via vapor-assisted solution process. J. Am. Chem. Soc. 136, 622-625 (2013).
11. Noh, J. H., Im, S. H., Heo, J. H., Mandal, T. N. & Seok, S. I. Chemical management for colorful, efficient, and stable inorganic-organic hybrid nanostructured solar cells. Nano Lett. 13, 1764-1769 (2013).
12. Pellet, N. et al. Mixed-organic-cation perovskite photovoltaics for enhanced solar-light harvesting. Angew. Chem. Int. Ed. 53, 3151-3157 (2014).
13. Ogomi, Y. et al. $CH_3NH_3Sn_xPb_{(1-x)}I_3$ perovskite solar cells covering up to 1060 nm. J. Phys. Chem. Lett. 5, 1004-1011 (2014).
14. Hao, F., Stoumpos, C. C., Chang, R. P. & Kanatzidis, M. G. Anomalous band gap behavior in mixed Sn and Pb perovskites enables broadening of absorption spectrum in solar cells. J. Am. Chem. Soc. 136, 8094-8099 (2014).
15. Zhao, Y. & Zhu, K. CH3NH3Cl-assisted one-step solution growth of $CH_3NH_3PbI_3$: structure, charge-carrier dynamics, and photovoltaic properties of perovskite solar cells. J. Phys. Chem. C 118, 9412-9418 (2014).
16. Moore, D. T., Sai, H., Tan, K. W., Estroff, L. A. & Wiesner, U. Impact of the organic halide salt on final perovskite composition for photovoltaic applications. APL Mater 2, 081802 (2014).
17. Eperon, G. E., Burlakov, V. M., Docampo, P., Goriely, A. & Snaith, H. J. Morphological Control for high performance, solution-processed planar heterojunction perovskite solar cells. Adv. Func. Mater. 24, 151-157 (2014).

18. Conings, B. et al. Perovskite-based hybrid solar cells exceeding 10% efficiency with high reproducibility using a thin film sandwich approach. Adv. Mater. 26, 2041-2046 (2014).
19. Mitzi D B. Synthesis, structure, and properties of organic-inorganic perovskites and related materials. Prog. Inorg. Chem. 48, 1-121 (2007).
20. Kojima A, Teshima K, Shirai Y, Miyasaka T. Organometal halide perovskites as visible-light sensitizers for photovoltaic cells. J. Am. Chem. Soc. 131, 6050-6051 (2009).
21. Tan Z-K, et al. Bright light-emitting diodes based on organometal halide perovskite. Nat. Nanotechnol. 9, 687-692 (2014).
22. Zhu H, et al. Lead halide perovskite nanowire lasers with low lasing thresholds and high quality factors. Nat. Mater. 14, 636-642 (2015).
23. Xing G, et al. Low-temperature solution-processed wavelength-tunable perovskites for lasing. Nat. Mater. 13, 476-480 (2014).
24. Dou L, et al. Solution-processed hybrid perovskite photodetectors with high detectivity. Nat. Commun. 5, 5404 (2014).
25. Xiao Z, et al. Giant switchable photovoltaic effect in organometal trihalide perovskite devices. Nat. Mater. 14, 193-198 (2015).
26. Liu M, Johnston M B, Snaith H J. Efficient planar heterojunction perovskite solar cells by vapour deposition. Nature 501, 395-398 (2013).
27. Bi C, Wang Q, Shao Y, Yuan Y, Xiao Z, Huang J. Non-wetting surface-driven high-aspect-ratio crystalline grain growth for efficient hybrid perovskite solar cells. Nat. Commun. 6, 7747 (2015).
28. Yang W S, et al. High-performance photovoltaic perovskite layers fabricated through intramolecular exchange. Science, 348, 1234-1237 (2015).
29. Nie W, et al. High-efficiency solution-processed perovskite solar cells with millimeter-scale grains. Science 347, 522-525 (2015).
30. Leo K. Perovskite photovoltaics: Signs of stability. Nat. Nanotechnol. 10, 574-575 (2015).
31. Green M A, Bein T. Photovoltaics: Perovskite cells charge forward. Nat. Mater. 14, 559-561 (2015).
32. Shao Y, Xiao Z, Bi C, Yuan Y, Huang J. Origin and elimination of photocurrent hysteresis by fullerene passivation in $CH_3NH_3PbI_3$ planar heterojunction solar cells. Nat. Commun. 5, 5784 (2014).
33. Zhang W, et al. Ultrasmooth organic-inorganic perovskite thin-film formation and crystallization for efficient planar heterojunction solar cells. Nat. Commun. 6, 6142 (2015).
34. Chen Q, et al. The optoelectronic role of chlorine in $CH_3NH_3PbI_3$ (Cl)-based perovskite solar cells. Nat. Commun. 6, 7269 (2015).
35. Liu M, Johnston M B, Snaith H J. Efficient planar heterojunction perovskite solar cells by vapour deposition. Nature 501, 395-398 (2013).
36. Burschka J, et al. Sequential deposition as a route to high-performance perovskite-sensitized solar cells. Nature 499, 316-319 (2013).
37. Eperon G E, Stranks S D, Menelaou C, Johnston M B, Herz L M, Snaith H J. Formamidinium lead trihalide: a broadly tunable perovskite for efficient planar heterojunction solar cells. Energy Environ. Sci 7, 982-988 (2014).
38. Eperon G E, Burlakov V M, Docampo P, Goriely A, Snaith H J. Morphological Control for High Performance, Solution-Processed Planar Heterojunction Perovskite Solar Cells. Adv. Funct. Mater. 24, 151-157 (2014).
39. Redecker M, Bradley D D, Inbasekaran M, Wu W W, Woo E P. High Mobility Hole Transport Fluorene-Triarylamine Copolymers. Adv. Mater. 11, 241-246 (1999).
40. Wang J, et al. Interfacial Control Toward Efficient and Low-Voltage Perovskite Light-Emitting Diodes. Adv. Mater. 27, 2311-2316 (2015).
41. Yan H, et al. High-performance hole-transport layers for polymer light-emitting diodes. Implementation of organosiloxane cross-linking chemistry in polymeric electroluminescent devices. J. Am. Chem. Soc. 127, 3172-3183 (2005).
42. De Bastiani M, D'Innocenzo V, Stranks S D, Snaith H J, Petrozza A. Role of the crystallization substrate on the photoluminescence properties of organo-lead mixed halides perovskites. APL Materials 2, 081509 (2014).
43. Vorpahl S M, et al. Impact of microstructure on local carrier lifetime in perovskite solar cells. Science 348, 683-686 (2015).
44. Shi D, et al. Low trap-state density and long carrier diffusion in organolead trihalide perovskite single crystals. Science 347, 519-522 (2015).
45. Dong Q, et al. Electron-hole diffusion lengths>175 μmin solution-grown $CH_3NH_3PbI_3$ single crystals. Science 347, 967-970 (2015).
46. Zhao D, Sexton M, Park H Y, Baure G, Nino J C, So F. High-Efficiency Solution-Processed Planar Perovskite Solar Cells with a PolymerHole Transport Layer. Adv. Energy Mater. 5, 1401855 (2015).
47. Krogstrup P, et al. Single-nanowire solar cells beyond the Shockley-Queisser limit. Nat. Photonics 7, 306-310 (2013).
48. Park S H, et al. Bulk heterojunction solar cells with internal quantum efficiency approaching 100%. Nat. Photonics 3, 297-302 (2009).
49. Armin A, et al. Quantum efficiency of organic solar cells: electro-optical cavity considerations. Acs Photonics 1, 173-181 (2014).
50. Brown G, Ager J, Walukiewicz W, Wu J. Finite element simulations of compositionally graded InGaN solar cells. Sol. Energy Mater. Sol. Cells 94, 478-483 (2010).
51. Lin Q, Armin A, Nagiri R C R, Burn P L, Meredith P. Electro-optics of perovskite solar cells. Nat. Photonics 9, 106-112 (2014).
52. Xu J, et al. Perovskite-fullerene hybrid materials suppress hysteresis in planar diodes. Nat. Commun. 6, 7081 (2015).
53. Tress W, Marinova N, Inganäs O, Nazeeruddin M, Zakeeruddin S M, Graetzel M. Predicting the Open-Circuit Voltage of $CH_3NH_3PbI_3$ Perovskite Solar Cells Using Electroluminescence and Photovoltaic Quantum Efficiency Spectra: the Role of Radiative and Non-Radiative Recombination. Adv. Energy Mater. 5, 1400812 (2015).
54. Tress W, Marinova N, Moehl T, Zakeeruddin S, Nazeeruddin M K, Grätzel M. Understanding the rate-dependent J-V hysteresis, slow time component, and aging in $CH_3NH_3PbI_3$ perovskite solar cells: the role of a compensated electric field. Energy Environ. Sci. 8, 995-1004 (2015).
55. Unger E, et al. Hysteresis and transient behavior in current-voltage measurements of hybrid-perovskite absorber solar cells. Energy Environ. Sci. 7, 3690-3698 (2014).

56. Wang K, Liu C, Du P, Zheng J, Gong X. Bulk heterojunction perovskite hybrid solar cells with large fill factor. Energy Environ. Sci. 8, 1245-1255 (2015).
57. Green M A, Emery K, Hishikawa Y, Warta W, Dunlop E D. Solar cell efficiency tables (Version 45). Prog. Photovoltaics Res. Appl. 23, 1-9 (2015).
58. Snaith H J, et al. Anomalous hysteresis in perovskite solar cells. J. Phys. Chem. Lett. 5, 1511-1515 (2014).
59. Jeon N J, et al. Compositional engineering of perovskite materials for high-performance solar cells. Nature 517, 476-480 (2015).
60. Ma W, Yang C, Gong X, Lee K, Heeger A J. Thermally stable, efficient polymer solar cells with nanoscale control of the interpenetrating network morphology. Adv. Funct. Mater. 15, 1617-1622 (2005).
61. Wang N, Chen Z, Wei W, Jiang Z. Fluorinated benzothiadiazole-based conjugated polymers for high-performance polymer solar cells without any processing additives or post-treatments. J. Am. Chem. Soc. 135, 17060-17068 (2013).
62. Xing G, et al. Long-range balanced electron- and hole-transport lengths in organic-inorganic $CH_3NH_3PbI_3$. Science 342, 344-347 (2013).
63. Salim T, et al. Elucidating the role of disorder and free-carrier recombination kinetics in $CH_3NH_3PbI_3$ perovskite films. Nat. Commun. 6, 7903 (2015).
64. Malinkiewicz O. et al. Metal-Oxide-Free Methylammonium Lead Iodide Perovskite-Based Solar Cells: the Influence of Organic Charge Transport Layers. Adv. Energy Mater. 2014, 4, 1400345.
65. Xiao Z. et al. Efficient, High Yield Perovskite Photovoltaic Devices Grown by Interdiffusion of Solution-Processed Precursor Stacking Layers. Energy Environ. Sci. 2014, 7, 2619-2623.
66. Boopathi K. M. et al. Preparation of Metal Halide Perovskite Solar Cells Through a Liquid Droplet Assisted Method. J. Mater. Chem. A. 2015, 3, 9257-9263.
67. Chen Y, Chen T., Dai L., Layer-by-layer Growth of $CH_3NH_3PBI_{3-x}C_x$ for Highly Efficient Planar Heterojunction Perovskite Solar Cells. Adv. Mater. 2015, 27, 1053-1059.

The invention claimed is:

1. A method for forming a perovskite thin film having an $ABX_3$ crystalline structure, wherein the crystalline structure comprises an average grain size of more than 1 micron, the method comprising:
    forming via vacuum thermal evaporation a layer of a metal (II) halide ($BX_2$) on a substrate;
    depositing via spin coating a solution of an organic halide or a metal (I) halide (AX) on the $BX_2$ layer; and
    annealing the $BX_2$ and AX layers to form the perovskite thin film, wherein A is $CH_3NH_3^+$, $CH_3N_2H_2^+$, or $Cs^+$, B is $Pb^{2+}$, $Sn^{2+}$, and X is $Cl^-$, $Br^-$ or $I^-$.
2. The method of claim 1, wherein forming the layer of $BX_2$ comprises evaporating $BX_2$ powder under vacuum of $1 \times 10^{-2}$ to $1 \times 10^{-5}$ Pa.
3. The method of claim 1, wherein forming the layer of $BX_2$ comprises depositing $BX_2$ at a deposition rate of 0.1 to 50 Å/s.
4. The method of claim 1, wherein forming the layer of $BX_2$ comprises evaporating $BX_2$ powder at 210 to 230° C.
5. The method of claim 1, wherein depositing the solution of AX comprises spin coating at a rotational speed of 150 to 15,000 rpm/s.
6. The method of claim 1, wherein depositing the solution of AX comprises spin coating for a period of 5 to 300 s.
7. The method of claim 1, wherein annealing the $BX_2$ and AX layers comprises annealing for a period of 0.01 to 24 h.
8. The method of claim 1, wherein annealing the $BX_2$ and AX layers comprises annealing at 90 to 300° C.
9. A perovskite thin film having an $ABX_3$ crystalline structure obtained from the method of claim 1, wherein the crystalline structure comprises an average grain size of more than 1 micron.
10. The perovskite thin film of claim 9, wherein the average grain size is 7 to 10 microns.
11. A method for forming a planar heterojunction perovskite solar cell, the method comprising:
    depositing a layer of poly(3,4-ethylene dioxythiophene)-poly(styrene sulfonate) (PEDOT:PSS) on a glass substrate pre-coated with indium-tin oxide (ITO);
    depositing a layer of poly(9,9-dioctylfluorene-co-N-(4-(3-methylpropyl))diphenylamine) (TFB) on the layer of PEDOT:PSS;
    forming via vacuum thermal evaporation a layer of a metal (II) halide ($BX_2$) on the layer of TFB;
    depositing via spin coating a solution of an organic halide or a metal (I) halide (AX) on the metal (II) halide layer;
    annealing the $BX_2$ and AX layers to form a perovskite thin film, wherein A is $CH_3NH_3^+$, $CH_3N_2H_2^+$, or $Cs^+$, B is $Pb^{2+}$, $Sn^{2+}$, and X is $Cl^-$, $Br^-$ or $I^-$;
    depositing a layer of [6,6]-phenyl-C61-butyric acid methyl ester (PCBM) on the perovskite thin film; and
    forming a top metal electrode on the PCBM layer to form the solar cell.

* * * * *